US011251256B2

(12) United States Patent
Moon et al.

(10) Patent No.: US 11,251,256 B2
(45) Date of Patent: Feb. 15, 2022

(54) DISPLAY APPARATUS

(71) Applicant: Samsung Display Co., Ltd., Yongin-si (KR)

(72) Inventors: Byungrok Moon, Yongin-si (KR); Jaehyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/031,752

(22) Filed: Sep. 24, 2020

(65) Prior Publication Data

US 2021/0296421 A1 Sep. 23, 2021

(30) Foreign Application Priority Data

Mar. 17, 2020 (KR) ........................ 10-2020-0032856

(51) Int. Cl.
*H01L 27/32* (2006.01)
*H01L 51/52* (2006.01)

(52) U.S. Cl.
CPC ........ *H01L 27/3276* (2013.01); *H01L 27/323* (2013.01); *H01L 51/5253* (2013.01)

(58) Field of Classification Search
CPC .............. H01L 27/3276; H01L 27/323; H01L 51/5253; H01L 51/5256
See application file for complete search history.

(56) References Cited

U.S. PATENT DOCUMENTS

| 10,283,575 | B2 * | 5/2019 | Zhai ...................... G06F 3/0412 |
| 10,847,751 | B2 * | 11/2020 | Lee ..................... H01L 51/5256 |
| 10,886,339 | B2 * | 1/2021 | Won .................... H01L 51/0097 |
| 2016/0208381 | A1 | 7/2016 | Choi et al. |
| 2019/0129548 | A1 | 5/2019 | Hwang et al. |
| 2019/0131379 | A1 | 5/2019 | Won et al. |
| 2020/0019281 | A1 | 1/2020 | Miyamoto et al. |

FOREIGN PATENT DOCUMENTS

| KR | 10-2016-0089034 A | 7/2016 |
| KR | 10-2019-0048784 A | 5/2019 |
| KR | 10-2019-0073919 A | 6/2019 |
| KR | 10-2019-0119113 A | 10/2019 |

* cited by examiner

*Primary Examiner* — Sardis F Azongha
(74) *Attorney, Agent, or Firm* — Lewis Roca Rothgerber Christie LLP

(57) ABSTRACT

A display apparatus includes a substrate including a display area and a peripheral area outside the display area, display elements arranged at the display area, an encapsulation layer covering the display elements, a sensor electrode layer arranged over the encapsulation layer, and a first connection wire group arranged in the peripheral area to be arranged between the display area and a first edge of the substrate, arranged outside the encapsulation layer, and including first connection wires, wherein a first distance from a first portion of an end of the encapsulation layer facing the first edge to the first edge is greater than a second distance from a second portion of the end of the encapsulation layer facing the first edge to the first edge, and wherein the first portion corresponds to the first connection wire group, and the second portion is different from the first portion.

37 Claims, 17 Drawing Sheets

DISPLAY APPARATUS

CROSS-REFERENCE TO RELATED APPLICATION

This application claims priority to and the benefit of Korean Patent Application No. 10-2020-0032856, filed on Mar. 17, 2020, the entire disclosure of which is hereby incorporated by reference.

BACKGROUND

1. Field

One or more embodiments relate to a display apparatus, and more particularly, to a display apparatus in which dead space may be reduced and a failure rate may be decreased.

2. Description of Related Art

In general, a display apparatus includes display elements to display an image. The display apparatus may be utilized in various suitable forms, and for example, may be utilized in various suitable electronic devices such as a smartphone, a digital camera, a laptop computer, navigation, or a smart television.

The display apparatus has a touchscreen function for user convenience. For example, the display apparatus may sense a user's touch input and display a corresponding image.

SUMMARY

A display apparatus of the related art has an area of dead space to display no image that is increased to implement a touchscreen function.

Aspects and features of one or more embodiments are directed toward a display apparatus in which dead space may be reduced and a failure rate may be decreased. However, aspects and features of the disclosure are not limited thereto.

Additional aspects and features will be set forth in part in the description which follows and, in part, will be apparent from the description, or may be learned by practice of the presented embodiments of the disclosure.

According to one or more embodiments, a display apparatus includes a substrate including a display area and a peripheral area outside the display area, display elements arranged at the display area of the substrate, an encapsulation layer covering the display elements, a sensor electrode layer arranged over the encapsulation layer, and a first connection wire group arranged in the peripheral area to be arranged between the display area and a first edge of the substrate, arranged outside the encapsulation layer, and including first connection wires, wherein a first distance from a first portion of an end of the encapsulation layer facing the first edge to the first edge is greater than a second distance from a second portion of the end of the encapsulation layer facing the first edge to the first edge, and wherein the first portion corresponds to the first connection wire group, and the second portion is different from the first portion.

The display apparatus may further include a second connection wire group arranged in the peripheral area to be arranged between the display area and the first edge, including second connection wires, and spaced apart from the first connection wire group, wherein a third distance from a third portion of the end of the encapsulation layer facing the first edge to the first edge may be greater than the second distance, and wherein the third portion may correspond to the second connection wire group.

The second portion may be between the first portion and the third portion.

When viewed in a direction vertical to the substrate, the end of the encapsulation layer facing the first edge may include an uneven structure.

A fourth portion of the end of the encapsulation layer facing the first edge may be different from the first portion and the second portion, and may be spaced apart from the second portion while the first portion is between the second portion and the fourth portion, and wherein the first distance may be greater than a fourth distance from the fourth portion to the first edge.

The fourth distance may be the same as the second distance.

The display apparatus may further include a wire extending from within the display area to a portion between the display area and the first edge to face the first connection wire group, wherein a center portion of an end of the wire facing the first connection wire group may be exposed to the outside of the first portion, wherein a first side end of the wire coupled to the end of the wire may be covered by the second portion, and a second side end of the wire coupled to the end of the wire may be covered by the fourth portion.

According to one or more embodiments, a display apparatus includes a substrate including a display area and a peripheral area outside the display area, display elements arranged at the display area of the substrate, an encapsulation layer covering the display elements, a sensor electrode layer arranged over the encapsulation layer, a first connection wire group arranged in the peripheral area to be arranged between the display area and a first edge of the substrate, arranged outside the encapsulation layer, and including first connection wires, and a wire extending from within the display area to a portion between the display area and the first edge to face the first connection wire group, the wire having an end facing the first connection wire group, wherein the encapsulation layer includes a main portion covering the display elements, a first protrusion protruding from the main portion to cover a first side end of the wire coupled to the end of the wire, and a second protrusion protruding from the main portion to cover a second side end of the wire coupled to the end of the wire.

When viewed in a direction vertical to the substrate (plan view), the first side end may include a portion having an uneven shape.

When viewed in a direction vertical to the substrate (plan view), the second side end may include a portion having an uneven shape.

The first connection wires and the wire may be arranged on the same layer.

The wire may include a three-layer structure.

Strengths of a lowermost layer and an uppermost layer of the wire may each be greater than a strength of an intermediate layer of the wire.

An area of an intermediate layer of the wire may be smaller than that of an uppermost layer of the wire, when viewed in a direction vertical to the substrate (plan view).

The display elements may include pixel electrodes and an opposite electrode arranged over the pixel electrodes and corresponding to the pixel electrodes, wherein the wire may be an electrode power supply line electrically coupled to the opposite electrode.

The display apparatus may further include pixel circuits arranged in the display area and electrically coupled to the display elements, wherein the wire may be a power supply line electrically coupled to the pixel circuits.

The display apparatus may further include sensor wires configured to electrically connect the sensor electrode layer to the first connection wires.

The sensor wires may be electrically coupled to ends of the first connection wires facing the display area.

According to one or more embodiments, a display apparatus includes a substrate including a display area and a peripheral area outside the display area, display elements arranged at the display area of the substrate, and an encapsulation layer covering the display elements and including a first inorganic film, wherein, when viewed in a direction vertical to the substrate (plan view), the first inorganic film has at least one recess at an edge corresponding to a first edge of the substrate.

The encapsulation layer may further include an organic film, and an edge of the organic film corresponding to the edge of the first inorganic film having the at least one recess may have a straight shape.

The encapsulation layer may further include an organic film, and an edge of the organic film corresponding to the edge of the first inorganic film having the at least one recess may have a shape corresponding to that of the first edge of the substrate.

The at least one recess may be recessed toward the display area.

The substrate may include a second edge opposite to the first edge with respect to a center of the display area, wherein, when viewed in a direction vertical to the substrate (plan view), the first inorganic film may have at least one recess at an edge corresponding to the second edge of the substrate.

The display apparatus may further include a sensor electrode layer arranged over the encapsulation layer and including a sensor area and a sensor peripheral area outside the sensor area, and wires extending toward the first edge of the substrate from the sensor peripheral area to the outside of the first inorganic film, wherein, when viewed in a direction vertical to the substrate (plan view), the wires may overlap the at least one recess.

The wires may include sensor wires extending from the sensor peripheral area to the outside of the first inorganic film and first connection wires electrically coupled to the sensor wires.

The sensor wires and the first connection wires may be electrically coupled to each other through contact holes defined in an insulating layer between the sensor wires and the first connection wires.

The encapsulation layer may further include a second inorganic film, and an edge of the second inorganic film corresponding to the edge of the first inorganic film having the at least one recess may have a shape corresponding to that of the edge of the first inorganic film having the at least one recess.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
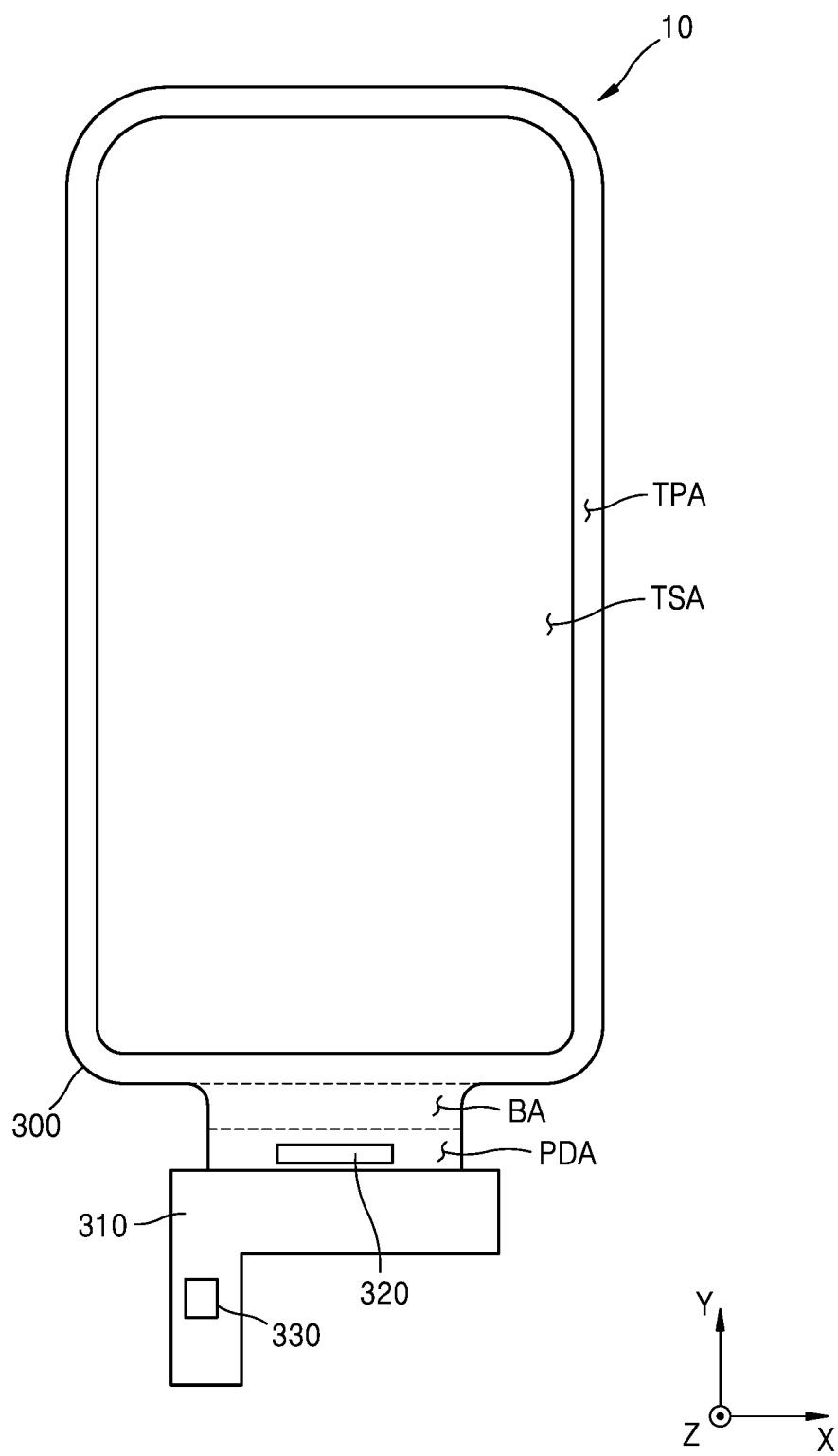
FIG. 1 is a schematic plan view of a portion of a display apparatus according to an embodiment.

Reference will now be made in more detail to embodiments, examples of which are illustrated in the accompanying drawings, wherein like reference numerals refer to like elements throughout. In this regard, the present embodiments may have different suitable forms and should not be construed as being limited to the descriptions set forth herein. Accordingly, the disclosed embodiments are merely described below, by referring to the figures, to explain aspects of the present description. As used herein, the term "and/or" includes any and all combinations of one or more of the associated listed items. As used herein, the singular forms "a", "an" and "the" are intended to include the plural forms as well, unless the context clearly indicates otherwise. Throughout the disclosure, the expression "at least one of a, b or c" indicates only a, only b, only c, both a and b, both a and c, both b and c, all of a, b, and c, or variations thereof. As used herein, the use of the term "may," when describing embodiments of the present disclosure, refers to "one or more embodiments of the present disclosure."

As the present description allows for various suitable changes and numerous embodiments, some embodiments will be illustrated in the drawings and described in the written description. Aspects and features of one or more embodiments and methods of accomplishing the same will become apparent from the following detailed description of the one or more embodiments, taken in conjunction with the accompanying drawings. However, the present disclosure may have different suitable forms and should not be construed as being limited to the descriptions set forth herein.

Hereinafter, embodiments will be described in more detail with reference to the accompanying drawings, wherein like reference numerals refer to like elements throughout and a repeated description thereof may not be provided.

It will be further understood that, when an element, layer, film, region, or plate is referred to as being "on" another element, layer, film, region, or plate, it can be directly or indirectly on the other element, layer, film, region, or plate. For example, intervening elements, layers, films, regions, or plates may be present. Sizes of components in the drawings may be exaggerated or reduced for convenience of description. For example, because sizes and thicknesses of components in the drawings may be exaggerated for convenience of description, the disclosure is not limited thereto. As used herein, the term "substantially," "about," "approximately," and similar terms are used as terms of approximation and not as terms of degree, and are intended to account for the inherent deviations in measured or calculated values that would be recognized by those of ordinary skill in the art.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Figure 2:
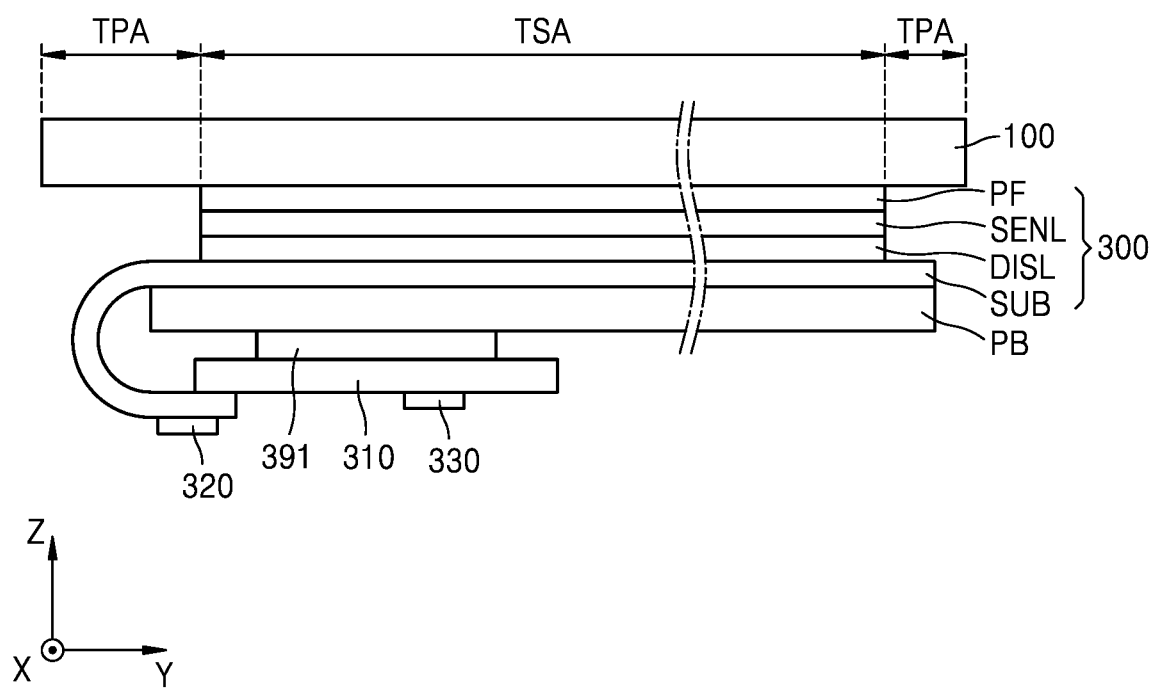
FIG. 2 is a schematic side view of a display apparatus including components shown in FIG. 1.

FIG. 1 is a schematic plan view of a portion of a display apparatus 10 according to an embodiment. FIG. 2 is a schematic side view of a display apparatus including components shown in FIG. 1. FIG. 2 shows a display panel 300 having a bent shape in a bending area BA (refer to FIG. 1). A substrate SUB may be a flexible substrate. The flexibility of the substrate SUB may allow for the display panel 300 to have the bent shape in the bending area BA. FIG. 1 shows a state in which the display panel 300 is not bent for convenience.

Referring to FIGS. 1 and 2, the display apparatus 10 according to the present embodiment is an apparatus to display a video (e.g., a moving image) or a still image and may be utilized as a display screen of not only portable electronic devices, such as a mobile phone, a smartphone, a tablet personal computer (PC), a mobile communication terminal, an electronic notebook, an e-book, a portable multimedia player (PMP), navigation, and an ultra mobile PC (UMPC), but may also be utilized as a display screen of various suitable products, such as a television, a notebook computer, a monitor, a billboard, and Internet of things (IoT). Also, the display apparatus 10 may be utilized in wearable devices such as a smartwatch, a watch phone, an eyeglass display, and a head mounted display (HMD). Also, the display apparatus 10 may be utilized as an instrument panel of a vehicle, a center information display (CID) arranged on a center fascia or dashboard of a vehicle, a room mirror display replacing a side mirror of a vehicle, a display arranged on the back of a front seat as entertainment for a back seat of a vehicle, etc.

FIGS. 1 and 2 show the display apparatus 10 according to the present embodiment being utilized as a smartphone for convenience of description. The display apparatus 10 according to the present embodiment includes a cover window 100, the display panel 300, a display circuit board 310, a display driver 320, a sensor driver 330, and a panel lower cover PB. In addition, the display apparatus 10 may further include a bracket, a main circuit board, a battery, and a lower cover.

Hereinafter, "on" may refer to a direction in which the cover window 100 is arranged with respect to the display panel 300, for example, a direction +z (z-axis direction), and "under" refers to a direction −z (negative z-axis direction), which is the opposite direction to the direction in which the cover window 100 is arranged with respect to the display panel 300. Also, "left" and "right" refer to directions when the display panel 300 is viewed in a direction vertical to the display panel 300 (e.g., when the display apparatus 10 is viewed in a plan view). For example, "left" refers to a direction −x (negative x-axis direction), and "right" refers to a direction +x (x-axis direction).

The display apparatus 10 may have a substantially rectangular shape as shown in FIG. 1 when the display apparatus 10 is viewed in a direction vertical to a surface thereof. For example, the display apparatus 10 may generally have a planar shape of a rectangle having short sides extending in a first direction (x-axis direction) and long sides extending in a second direction (y-axis direction) as shown in FIG. 1. Corners where the short sides extending in the first direction and the long sides extending in the second direction meet each other may have a round shape or a right-angled shape. However, a planar shape of the display apparatus 10 is not limited to a rectangle and may be other polygonal, circular, or elliptical shapes.

As shown in FIG. 2, the cover window 100 may be arranged on the display panel 300 to cover an upper surface of the display panel 300. The cover window 100 may protect an upper surface of the display panel 300.

The display panel 300 may be arranged under the cover window 100. The display panel 300 may overlap a transmission portion of the cover window 100. The display panel 300 may include the substrate SUB and display elements on the substrate SUB. FIG. 2 shows the display panel 300 including the substrate SUB, a display layer DISL, a sensor electrode layer SENL, and a polarizing film PF.

The display panel 300 displays (outputs) information processed by the display apparatus 10. For example, the display panel 300 may display execution screen information of an application driven by the display apparatus 10 or user interface (UI) and graphical user interface (GUI) information according to the execution screen information. The display panel 300 may include the display layer DISL to display an image and the sensor electrode layer SENL to sense a user's touch input. Thus, the display panel 300 may serve as one of input devices to provide an input interface between the display apparatus 10 and a user and may also serve as one of output portions to provide an output interface between the display apparatus 10 and a user.

The substrate SUB included in the display panel 300 may include (e.g., be) an insulating material such as glass, quartz, and/or polymer resin. The substrate SUB may be a suitably rigid substrate or may be a flexible substrate that may be bent, folded, rolled, etc. FIG. 2 shows the display panel 300 having a bent shape in the bending area BA (refer to FIG. 1). The display panel 300 may be bent in the bending area BA because the substrate SUB is a flexible substrate. Although FIG. 2 shows only the substrate SUB being bent, the disclosure is not limited thereto. At least a portion of the display layer DISL and/or at least a portion of the sensor electrode layer SENL may also be in the bending area BA (refer to FIG. 1) and a pad area (e.g., pad area PDA), and in this case, a portion of the display layer DISL and a portion of the sensor electrode layer SENL may also be bent in the bending area BA.

The substrate SUB has a display area and a peripheral area outside the display area, and display elements are at (e.g., on or in) the display area of the substrate SUB. The display layer DISL of FIG. 2 may be understood as a layer including display elements arranged on the substrate SUB. For example, the display layer DISL may include a thin film transistor layer including thin film transistors, a display element layer including display elements such as an organic light-emitting element, and an encapsulation layer for encapsulating the display element layer.

The peripheral area of the substrate SUB may be an area to display no image. The peripheral area may surround the display area. The peripheral area may be an area from an edge of the display area to an edge of the display panel 300. Not only pixels but also scan wires, data wires, and power wires coupled (e.g., connected) to the pixels may be arranged in the display area. A scan driver to apply scan signals to the scan wires and fan-out wires configured to connect the data wires and the display driver 320 to each other may be arranged in the peripheral area.

The display elements may include, for example, light-emitting elements. For example, the display panel 300 may be an organic light-emitting display panel to utilize an organic light-emitting diode including an organic light-emitting layer, a micro light-emitting diode (LED) display panel to utilize a micro LED, a quantum dot light-emitting display panel to utilize a quantum dot light-emitting diode including a quantum dot light-emitting layer, or an inorganic light-emitting display panel to utilize an inorganic light-emitting element including an inorganic semiconductor.

As shown in FIG. 1, the sensor electrode layer SENL may include a sensor area TSA and a sensor peripheral area TPA. The sensor area TSA in which sensor electrodes are arranged may be an area for sensing a user's touch input. The sensor peripheral area TPA is an area in which sensor electrodes are not arranged, and may have a shape surrounding the sensor area TSA. The sensor peripheral area TPA may be an area from an edge of the sensor area TSA to the edge of the display panel 300. Sensor electrodes, connection portions, and conductive patterns may be arranged in the sensor area TSA. Sensor wires coupled to the sensor electrodes may be arranged in the sensor peripheral area TPA.

As described above, the substrate SUB included in the display panel 300 includes a display area and a peripheral area outside the display area. The sensor area TSA may overlap the display area, and the sensor peripheral area TPA may overlap the peripheral area. The peripheral area outside the display area may be a larger area including the sensor peripheral area TPA.

The sensor electrode layer SENL may sense a user's touch input by utilizing at least one selected from among various suitable touch methods such as a resistive method and a capacitive method. For example, when the sensor electrode layer SENL senses a user's touch input in a capacitive manner, the sensor driver 330 may apply driving signals to driving electrodes from among the sensor electrodes, and the sensor driver 330 may, through sensing electrodes from among the sensor electrodes, sense voltages charged in mutual capacitances between the driving electrodes and the sensing electrodes, thereby determining a user's touch. The user's touch may include a contact touch and/or a proximity touch. The contact touch means that an object, such as a user's finger or a pen, contacts or directly contacts the cover window 100 arranged on a sensor electrode layer. The proximity touch means, that an object such as a user's finger or a pen is close to the cover window 100 but is away from the cover window 100 (e.g., hovering close to the cover window 100). The sensor driver 330 may transmit sensor data to a main processor according to the sensed voltages, and the main processor may compute a touch coordinate where a touch input occurs by analyzing (e.g., utilizing) the sensor data.

The polarizing film PF may be arranged on the sensor electrode layer SENL. The polarizing film PF may include a linear polarizing plate and a phase retardation film such as a λ/4 plate (quarter wave plate). The phase retardation film may be arranged on the sensor electrode layer SENL, and the linear polarizing plate may be arranged on the phase retardation film.

The display panel 300 may be a rigid display panel that is suitably rigid and does not bend easily, or the display panel 300 may be a flexible display panel that is flexible and may be easily bent, folded, and/or rolled. For example, the display panel 300 may be a foldable display panel that may be folded and unfolded, a curved display panel in which at least a portion of a display surface is bent or bendable, a bent display panel in which an area excluding a display surface is bent or bendable, a rollable display panel that may be rolled or spread, or a stretchable display panel. The stretchable display panel may, for example, be configured to be stretched or warped.

The display panel 300 may be a transparent display panel. In this case, the display panel 300 may have suitable transparency, and thus, a user may view an object or background arranged under the display panel 300 from an upper surface of the display panel 300. In some embodiments, the display panel 300 may be a reflective display panel that may reflect an object or background on the display panel 300. The reflective display panel may, for example, reflect an image of the object or background incident on the display panel 300.

As shown in FIG. 1, the display panel 300 may have the bending area BA on one side (in a direction -y (negative y-axis direction)), and thus, as shown in FIG. 2, the display panel 300 may be bent in the bending area BA. For example, FIG. 1 shows a state in which the display panel 300 is not bent for convenience. As described above, as the display panel 300 is bent, a pad area PDA is under another portion (in the direction -z) of the display panel 300.

The bending area BA and the pad area PDA may protrude from the sensor peripheral area TPA on one side of the display panel 300 in an opposite direction (the direction -y) of the second direction (y-axis direction). Although FIGS. 1 and 2 show lengths of the bending area BA and the pad area PDA in the first direction (x-axis direction) less than a length of the sensor area TSA in the first direction (x-axis direction), the disclosure is not limited thereto.

As described above, the display panel 300 may be bent in the bending area BA, and accordingly, the pad area PDA may overlap the sensor area TSA in a thickness direction (z-axis direction) of the display panel 300. The display driver 320 and the display circuit board 310 may be arranged in the pad area PDA.

The display driver 320 may receive control signals and power voltages and may generate and output signals and voltages for driving the display panel 300. The display driver 320 may include an integrated circuit (IC).

The display circuit board 310 may be electrically coupled (e.g., electrically connected) to the display panel 300. For example, as shown in FIG. 2, the display circuit board 310 may be electrically coupled to a pad portion on the substrate SUB. For example, the display circuit board 310 may be electrically coupled to the pad portion of the substrate SUB by an anisotropic conductive film.

The display circuit board 310 may be a flexible printed circuit board (FPCB) that may be bent (e.g., bendable), or the display circuit board 310 may be a rigid printed circuit board (PCB) that is suitably hard and does not bend easily. In some cases, the display circuit board 310 may be a complex PCB including both of a rigid PCB and an FPCB.

The sensor driver 330 may be arranged on the display circuit board 310. The sensor driver 330 may include an IC.

The sensor driver 330 may be attached on the display circuit board 310. The sensor driver 330 may be electrically coupled to sensor electrodes of a sensor electrode layer of the display panel 300 through the display circuit board 310.

In some embodiments, a power supplier to supply driving voltages for driving pixels of the display panel 300, a scan driver, and the display driver 320 may be additionally arranged on the display circuit board 310. In some embodiments, the display driver 320 may be on the substrate SUB. In some embodiments, a power supplier may be integrated with the display driver 320, and in this case, the display driver 320 and the power supplier may be implemented as one IC.

The display circuit board 310 may be electrically coupled to a main circuit board. The main circuit board may include, for example, a main processor including an IC, a camera device, a wireless communicator, an input portion, an output portion, an interface portion, a memory and/or a power supplier.

The panel lower cover PB may be arranged under the display panel 300. The panel lower cover PB may be attached to a lower surface of the display panel 300 through an adhesive member. The adhesive member may be a pressure sensitive adhesive (PSA). The panel lower cover PB may include at least one selected from among a light absorbing member to absorb light incident from the outside, a shock absorbing member to absorb shock from the outside, and a heat dissipation member to efficiently dissipate heat of the display panel 300. Also, an adhesive member 391 may be arranged between the panel lower cover PB and the display circuit board 310, and thus, the display circuit board 310 may be fixed to the panel lower cover PB.

The light absorbing member may be arranged under the display panel 300. The light absorbing member prevents or blocks transmission of light, and thus prevents or blocks components arranged under the light absorbing member, for example, the display circuit board 310 and the like, from being viewed from the top of the display panel 300 (e.g., viewed in a plan view). The light absorbing member may include (e.g., be) a light absorbing material such as a black pigment and/or a black dye.

The shock absorbing member may be arranged under the light absorbing member. The shock absorbing member prevents or reduces damage to the display panel 300 by absorbing external shock. The shock absorbing member may have a single-layer structure or a multilayer structure. For example, the shock absorbing member may include (e.g., be) polymer resin such as polyurethane, polycarbonate, polypropylene, polyethylene, etc., or the shock absorbing member may include (e.g., be) an elastic material such as a sponge foamed with rubber, a urethane-based material, and/or an acryl-based material.

The heat dissipation member may be arranged under the shock absorbing member. The heat dissipation member may include a first heat dissipation layer including (e.g., being) graphite and/or carbon nanotube and a second heat dissipation layer including (e.g., being) a metal thin film, such as copper, nickel, ferrite, and/or silver, capable of shielding electromagnetic waves and having excellent thermal conductivity.

Figure 3:
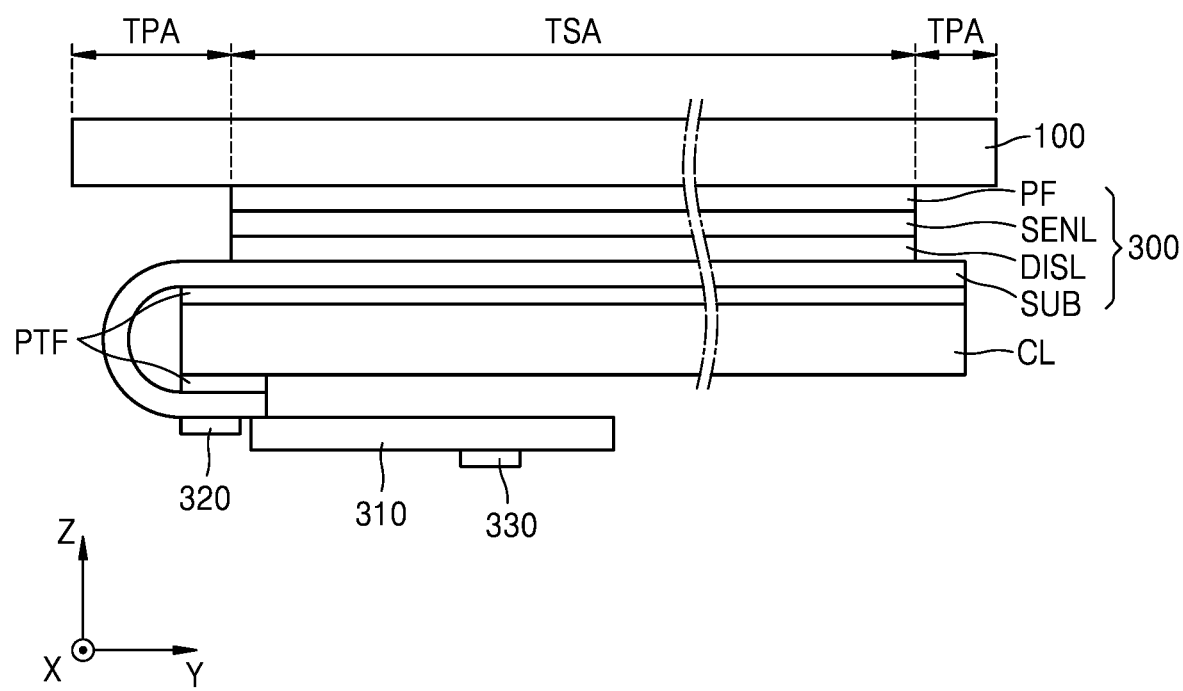
FIG. 3 is a schematic side view of a portion of a display apparatus according to another embodiment.

However, a structure of a display apparatus of the disclosure is not limited to the structure shown in FIG. 2. For example, although FIG. 2 shows the display circuit board 310 coupled to a pad portion arranged on a back side (e.g., bottom side) of the substrate SUB by an anisotropic conductive film, the display circuit board 310 may be coupled to a pad portion arranged on a front side (e.g., top side) of the substrate SUB by an anisotropic conductive film as shown in FIG. 3, which is a schematic side view of a portion of a display apparatus according to another embodiment. In addition, a patterned protective film PTF may be attached to a back side of the substrate SUB. For example, the patterned protective film PTF may be attached to a back side of the substrate SUB but may be attached to a portion excluding a bending area of the substrate SUB. The patterned protective film PTF may include a first portion corresponding to a portion including a center portion of the substrate SUB and a second portion spaced apart therefrom and corresponding to one side edge portion of the substrate SUB. For example, the first portion of the patterned protective film PTF may correspond to the center portion of the substrate SUB. A cushion layer CL may be arranged between the first portion and the second portion of the patterned protective film PTF. For example, the cushion layer CL may separate the first portion and the second portion of the patterned protective film PTF along a third direction (z-axis direction).

Figure 4:
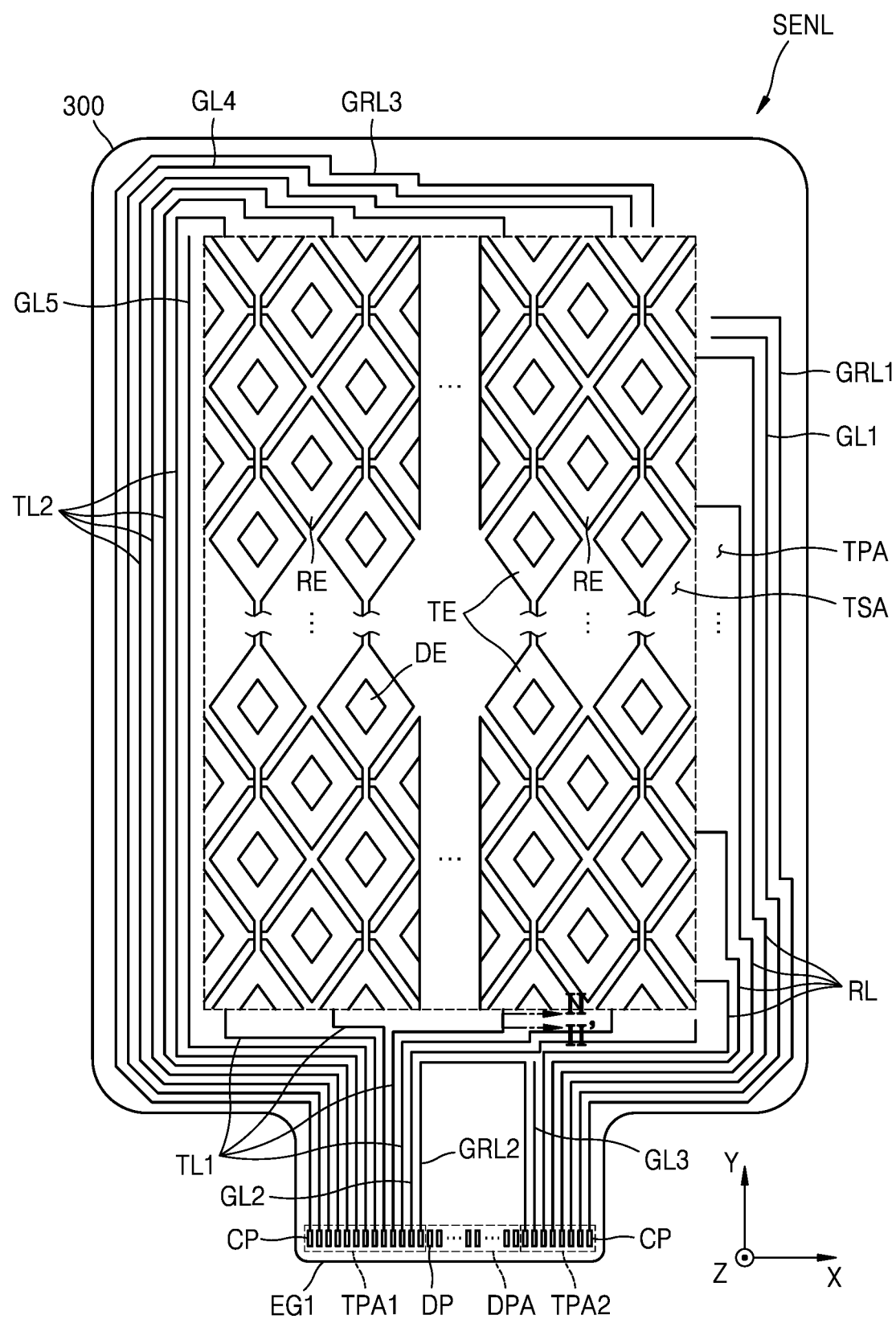
FIG. 4 is a schematic plan view of a portion of the display apparatus of FIG. 1.

FIG. 4 is a schematic plan view of the sensor electrode layer SENL, which is a portion of the display apparatus 10 of FIG. 1. Although FIG. 4 shows the sensor electrode layer SENL being flat for convenience, as described above with reference to FIG. 2, a portion of the sensor electrode layer SENL may be bent in the bending area BA.

FIG. 4 shows sensor electrodes TE and RE of the sensor electrode layer SENL including two types (e.g., kinds) of electrodes, for example, driving electrodes TE and sensing electrodes RE. Hereinafter, a case will be mainly described, with reference to FIG. 4, of being driven by a two-layer mutual capacitance method in which voltages charged in mutual capacitances are sensed through the sensing electrodes RE after a driving signal is applied to the driving electrodes TE. For convenience of description and convenience of illustration, FIG. 4 shows only the sensor electrodes TE and RE, dummy patterns DE, sensor wires TL1, TL2, and RL, sensor pad areas TPA1 and TPA2, guard wires GL1 to GL5, and ground wires CRL1 to CRL3. For example, connection wires such as first connection wires (CW1 shown in FIGS. 8-10) and second connection wires (CW2 shown in FIG. 10) are shown as parts of sensor wires TL1, TL2, and RL in FIG. 4, for convenience of illustration.

Referring to FIG. 4, the sensor electrode layer SENL includes the sensor area TSA for sensing a user's touch and the sensor peripheral area TPA arranged around the sensor area TSA. As described above, the substrate SUB included in the display panel 300 includes a display area and a peripheral area outside the display area, and the sensor area TSA may overlap the display area and the sensor peripheral area TPA may overlap the peripheral area. The peripheral area outside the display area may be a larger area including the sensor peripheral area TPA.

The sensor electrodes TE and RE may include first sensor electrodes TE and second sensor electrodes RE. Hereinafter, a case where the first sensor electrode is a driving electrode TE and the second sensor electrode is a sensing electrode RE will be described. Although FIG. 4 shows the driving electrodes TE, the sensing electrodes RE, and the dummy patterns DE each having a planar shape of a rhombus, the disclosure is not limited thereto.

The sensing electrodes RE may be arranged with each other in the first direction (x-axis direction) and may be electrically coupled to each other. For example, sensing electrodes RE adjacent to each other in the first direction (x-axis direction) may be electrically coupled to each other. The driving electrodes TE may be arranged with each other in the second direction (y-axis direction) crossing the first direction (x-axis direction) and may be electrically coupled to each other. For example, driving electrodes TE adjacent to each other in the second direction (y-axis direction) may be electrically coupled to each other. The driving electrodes TE and the sensing electrodes RE may be electrically separated from each other. The driving electrodes TE and the sensing electrodes RE may be arranged apart from each other (e.g., spaced apart from each other in a planar view). To electrically separate the sensing electrodes RE and the driving electrodes TE from each other in their crossing regions, the driving electrodes TE adjacent to each other in the second direction (y-axis direction) may be coupled to each other through a first connection portion BE1, and the sensing electrodes RE adjacent to each other in the first direction (x-axis direction) may be coupled to each other through a second connection portion BE2.

The dummy patterns DE may be electrically separated from the driving electrodes TE and the sensing electrodes RE. The driving electrodes TE, the sensing electrodes RE, and the dummy patterns DE may be arranged apart from one another (e.g., spaced apart from each other in a planar view). The dummy patterns DE may each be surrounded by the driving electrode TE or the sensing electrode RE. The dummy patterns DE may each be electrically floated.

Due to the dummy patterns DE, a parasitic capacitance between an opposite electrode 173 (refer to FIG. 8) of a display element described below and the driving electrode TE, or a parasitic capacitance between an opposite electrode and the sensing electrode RE may be reduced. When the parasitic capacitance is reduced, there is an advantage of increasing a charging speed at which a mutual capacitance between the driving electrode TE and the sensing electrode RE is charged. However, areas of the driving electrode TE and the sensing electrode RE may decrease due to the presence of the dummy patterns DE, and accordingly, a mutual capacitance between the driving electrode TE and the sensing electrode RE may be reduced. As a result, a voltage charged in the mutual capacitance may be easily affected by noise. Accordingly, it is required to properly (e.g., suitably) set areas of the dummy patterns DE by taking into account a parasitic capacitance and a mutual capacitance.

The sensor wires TL1, TL2, and RL may be arranged in the sensor peripheral area TPA. The sensor wires TL1, TL2, and RL may include sensing wires RL coupled to the sensing electrodes RE and first driving wires TL1 and second driving wires TL2 coupled to the driving electrodes TE.

The sensing electrodes RE arranged at (e.g., on) one side of the sensor area TSA may be coupled to the sensing wires RL. For example, as shown in FIG. 4, a sensing electrode arranged at the right end from among the sensing electrodes RE electrically coupled to each other in the first direction (x-axis direction) may be coupled to a sensing wire RL. The sensing wires RL may be coupled to second sensor pads in a second sensor pad area TPA2. Thus, the sensor driver 330 may be electrically coupled to the sensing electrodes RE.

The driving electrodes TE arranged at (e.g., on) one side of the sensor area TSA may be coupled to the first driving wires TL1, and the driving electrodes TE arranged on another side (e.g., a side opposite to the one side) of the sensor area TSA may be coupled to the second driving wires TL2. For example, as shown in FIG. 4, from among the driving electrodes TE electrically coupled to each other in the second direction (y-axis direction), the driving electrode TE arranged at the lower end may be coupled to a first driving wire TL1, and the driving electrode TE arranged at the upper end may be coupled to a second driving wire TL2.

The second driving wires TL2 may be coupled to the driving electrodes TE at an upper side of the sensor area TSA via a left outer side of the sensor area TSA. The first driving wires TL1 and the second driving wires TL2 may be coupled to first sensor pads in a first sensor pad area TPA1. For example, the second driving wires TL2 may extend from the first sensor pads along the left outer side of the sensor area TSA to be coupled to the driving electrodes TE at the upper side of the sensor area TSA. Thus, the sensor driver 330 may be electrically coupled to the driving electrodes TE.

A first guard wire GL1 may be arranged on an outer side of the outermost sensing wire RL from among the sensing wires RL. Also, a first ground wire GRL1 may be arranged on an outer side of the first guard wire GL1. As shown in FIG. 4, the first guard wire GL1 may be arranged on a right side of the sensing wire RL arranged at the right end from among the sensing wires RL, and the first ground wire GRL1 may be arranged on a right side of the first guard wire GL1.

A second guard wire GL2 may be arranged between the innermost sensing wire RL from among the sensing wires RL and the first driving wire TL1 arranged at the right end from among the first driving wires TL1. As shown in FIG. 4, the innermost sensing wire RL from among the sensing wires RL may be the sensing wire RL arranged at the left end from among the sensing wires RL. Also, the second guard wire GL2 may be arranged between the first driving wire TL1 arranged at the right end from among the first driving wires TL1 and a second ground wire GRL2.

A third guard wire GL3 may be arranged between the innermost sensing wire RL from among the sensing wires RL and the second ground wire GRL2. The second ground wire GRL2 may be coupled to the rightmost first sensor pad from among the first sensor pads in the first sensor pad area TPA1 and to the leftmost second sensor pad from among the second sensor pads in the second sensor pad area TPA2.

A fourth guard wire GL4 may be arranged on an outer side of the outermost second driving wire TL2 from among the second driving wires TL2. As shown in FIG. 4, the fourth guard wire GL4 may be arranged on a left side of the second driving wire TL2 arranged at the left end from among the second driving wires TL2. A third ground wire GRL3 may be arranged on an outer side of the fourth guard wire GL4. As shown in FIG. 4, the fourth guard wire GL4 may be arranged on left and upper sides of the second driving wire TL2 arranged at the left and upper end from among the second driving wires TL2, and the third ground wire GRL3 may be arranged on left and upper sides of the fourth guard wire GL4.

A fifth guard wire GL5 may be arranged on an inner side of the innermost second driving wire TL2 from among the second driving wires TL2. As shown in FIG. 4, the fifth guard wire GL5 may be arranged between the second driving wire TL2 arranged at the right end from among the second driving wires TL2 and the sensing electrodes RE.

A ground voltage may be applied to the first ground wire CRL1, the second ground wire GRL2, and the third ground wire GRL3. Also, a ground voltage may be applied to the first guard wire GL1, the second guard wire GL2, the third guard wire GL3, the fourth guard wire GL4, and the fifth guard wire GL5.

As shown in FIG. 4, the driving electrodes TE adjacent to each other in the second direction (y-axis direction) are electrically coupled to each other, and the driving electrodes TE adjacent to each other in the first direction (x-axis direction) are electrically insulated from each other. Also, the sensing electrodes RE adjacent to each other in the first direction (x-axis direction) are electrically coupled to each other, and the sensing electrodes RE adjacent to each other in the second direction (y-axis direction) are electrically insulated from each other. Thus, a mutual capacitance may be formed at the crossing or intersection of the driving electrodes TE and the sensing electrodes RE.

Also, as shown in FIG. 4, the first guard wire GL1 is arranged between the outermost sensing wire RL and the first ground wire GRL1. Accordingly, influence of a voltage change of the first ground wire GRL1 on the outermost sensing wire RL may be reduced. The second guard wire GL2 is arranged between the innermost sensing wire RL and the outermost (e.g., rightmost) first driving wire TL1. Accordingly, influence of voltage changes on the innermost sensing wire RL and the outermost first driving wire TL1 may be reduced. For example, influence of a voltage change of the innermost sensing wire RL on the outermost first driving wire TL1 may be reduced, and influence of a voltage change of the outermost first driving wire TL1 on the innermost sensing wire RL may be reduced. The third guard wire GL3 is arranged between the innermost sensing wire RL and the second ground wire GRL2. Accordingly, influence of a voltage change of the second ground wire GRL2 on the innermost sensing wire RL may be reduced. The fourth guard wire GL4 is arranged between the outermost second driving wire TL2 and the third ground wire GRL3. Accordingly, influence of a voltage change of the third ground wire GRL3 on the second driving wire TL2 (e.g., the outermost second driving wire TL2) may be reduced. The fifth guard wire GL5 is arranged between the innermost second driving wire TL2 and the sensor electrodes TE and RE. Accordingly, influence (e.g., influence of voltage changes) of the innermost second driving wire TL2 and the sensor electrodes TE and RE on each other may be reduced.

Figure 5:
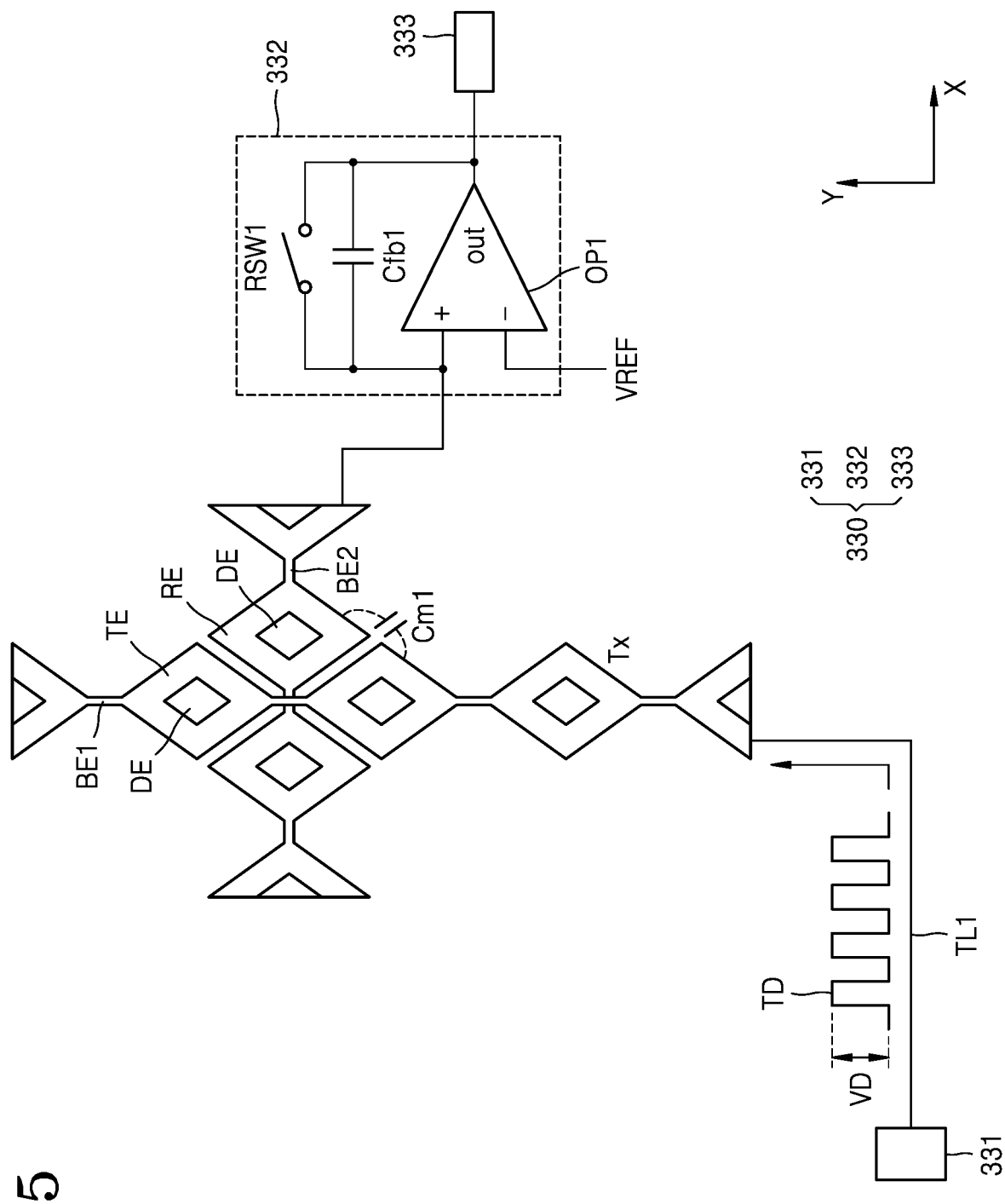
FIG. 5 is a schematic conceptual diagram of a portion of FIG. 4.

FIG. 5 is an example diagram showing the sensor driver 330 coupled to sensor electrodes.

For convenience of description, FIG. 5 shows the driving electrodes TE arranged in one column and electrically coupled to each other in the second direction (y-axis direction), and shows the sensing electrodes RE arranged in one row and electrically coupled to each other in the first direction (x-axis direction).

Referring to FIG. 5, the sensor driver 330 may include a driving signal output portion 331, a first sensor sensing portion 332, and a first analog-to-digital converter 333.

The driving signal output portion 331 may output a touch driving signal TD to the driving electrodes TE through the first driving wire TL1 and may output the touch driving signal TD to the driving electrodes TE through the second driving wire TL2. The touch driving signal TD may include a plurality of pulses. In some embodiments, the touch driving signal TD may be an electric current or a voltage, and a pulse of the plurality of pulses of the touch driving signal TD may have an amplitude VD.

The driving signal output portion 331 may output touch driving signals TD to the driving wires TL1 and TL2 according to a previously determined order. For example, the driving signal output portion 331 may sequentially output the touch driving signals TD from the driving electrodes TE arranged on a left side of the touch sensor area TSA of FIG. 4 to the driving electrodes TE arranged on a right side of the touch sensor area TSA.

The first sensor sensing portion 332 senses a voltage charged in a first mutual capacitance Cm1 through the sensing wire RL electrically coupled to the sensing electrodes RE. As shown in FIG. 5, the first mutual capacitance Cm1 may be formed between the driving electrode TE and the sensing electrode RE.

The first sensor sensing portion 332 may include a first operational amplifier OP1, a first feedback capacitor Cfb1, and a first reset switch RSW1. The first operational amplifier OP1 may include a first input terminal (−), a second input terminal (+), and an output terminal (out). The second input terminal (+) of the first operational amplifier OP1 may be coupled to the sensing wire RL, an initialization voltage VREF may be supplied to the first input terminal (−), and the output terminal (out) of the first operational amplifier OP1 may be coupled to a first storage capacitor. The first storage capacitor is coupled between the output terminal (out) of the first operational amplifier OP1 and ground (e.g., a ground voltage source) to store an output voltage Vout1 of the first operational amplifier OP1. The first feedback capacitor Cfb1 and the first reset switch RSW1 may be coupled in parallel between the second input terminal (+) and the output terminal (out) of the first operational amplifier OP1. The first reset switch RSW1 controls connection of both ends (e.g., controls a connection between both ends) of the first feedback capacitor Cfb1. When the first reset switch RSW1 is turned on to connect both ends of the first feedback capacitor Cfb1, the first feedback capacitor Cfb1 may be reset.

The output voltage Vout1 of the first operational amplifier OP1 may be defined as $Vout1=(Cm1 \times Vt1)/Cfb1$. In this regard, "Cfb1" refers to a capacitance of the first feedback capacitor, and "Vt1" refers to a voltage charged in the first mutual capacitance Cm1.

The first analog-to-digital converter 333 may convert and output the output voltage Vout1 stored in the first storage capacitor into first digital data.

As shown in FIG. 5, the sensor electrode layer SENL may determine a user's touch by sensing voltages charged in first mutual capacitances Cm1.

Figure 6:
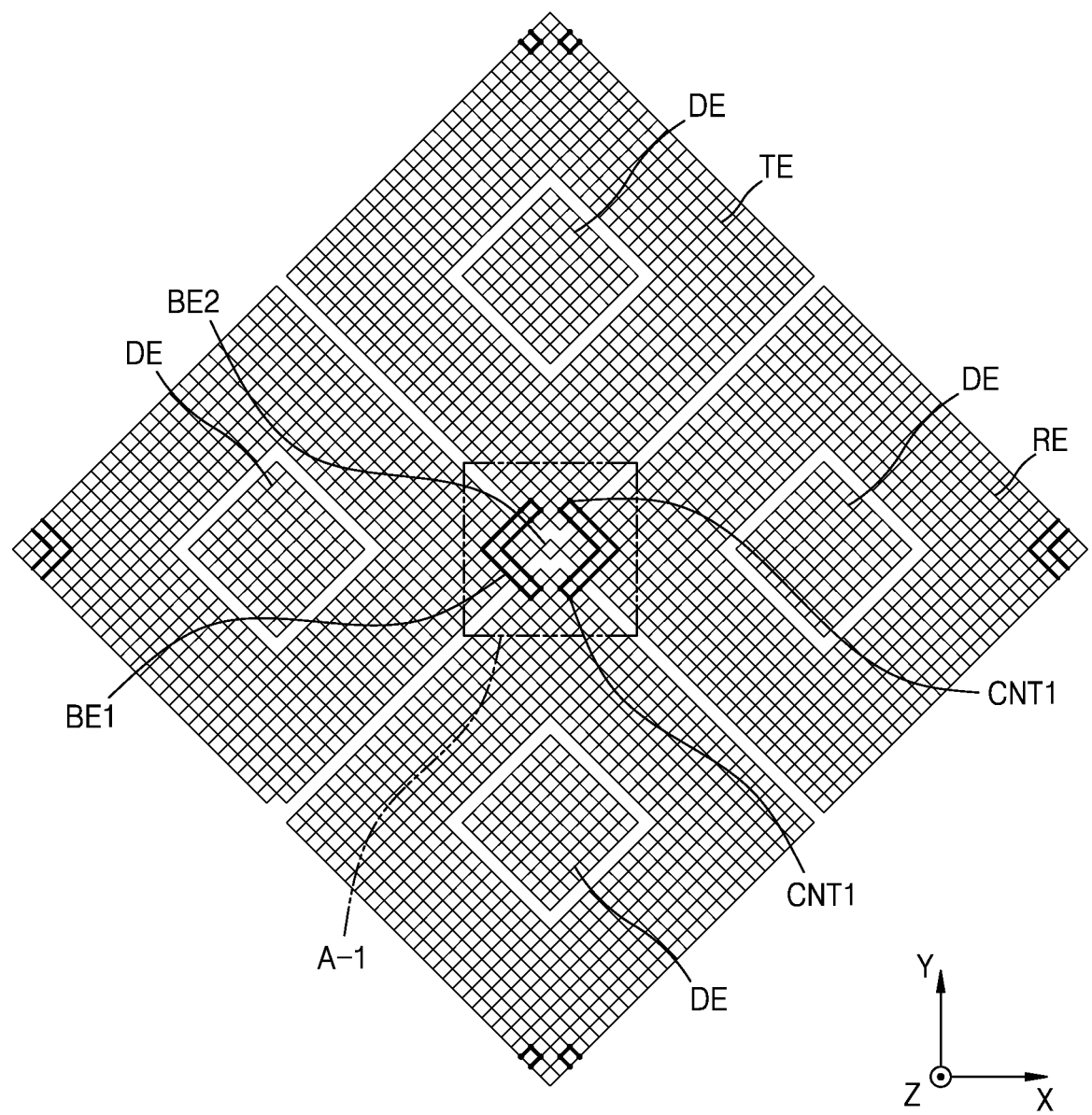
FIG. 6 is an enlarged plan view showing a portion of FIG. 5.

FIG. 6 is an enlarged plan view showing the sensor area TSA of FIG. 4 in more detail. For convenience of description, FIG. 6 shows only two sensing electrodes RE adjacent to each other in the first direction (x-axis direction) and two driving electrodes TE adjacent to each other in the second direction (y-axis direction).

Referring to FIG. 6, although the driving electrodes TE, the sensing electrodes RE, and the dummy patterns DE may each have a planar shape of a quadrilateral in a plan view taken in a direction vertical to the substrate SUB, the disclosure is not limited thereto. Also, the driving electrodes TE, the sensing electrodes RE, the dummy patterns DE, first connection portions BE1, and the second connection portion BE2 may appear to have a mesh structure in a plan view taken in a direction vertical to the substrate SUB.

The sensing electrodes RE may be arranged in the first direction (x-axis direction) and may be electrically coupled to each other. The driving electrodes TE may be arranged in the second direction (y-axis direction) and may be electrically coupled to each other. A dummy pattern DE may be surrounded by the driving electrode TE or the sensing electrode RE. The driving electrodes TE, the sensing electrodes RE, and the dummy patterns DE may be electrically separated from one another. The driving electrodes TE, the sensing electrodes RE, and the dummy patterns DE may be arranged apart from one another (e.g., spaced apart from one another in a plan view).

To electrically separate the sensing electrodes RE and the driving electrodes TE from each other in their crossing regions, the driving electrodes TE adjacent to each other in the second direction (y-axis direction) may be coupled to each other through the first connection portions BE1, and the sensing electrodes RE adjacent to each other in the first direction (x-axis direction) may be coupled to each other through the second connection portion BE2. The first connection portion BE1 is formed on a different layer from the driving electrodes TE and may be coupled to the driving electrodes TE through first contact holes CNT1. For example, the first connection portion BE1 may be arranged on a second buffer film BF2 (refer to FIG. 8), and the driving electrodes TE may be arranged on a first sensor insulating film TINS1 (refer to FIG. 8).

The first connection portions BE1 may have a shape that is bent at least once. Although FIG. 6 shows the first connection portions BE1 having a bent shape like an angle bracket (e.g., "<" or ">"), a shape of the first connection portions BE1 is not limited thereto. Also, the driving electrodes TE adjacent to each other in the second direction (y-axis direction) may be coupled to each other by the first connection portions BE1 to allow the driving electrodes TE adjacent to each other in the second direction (y-axis direction) to be stably coupled to each other even when one of the first connection portions BE1 is uncoupled (e.g., disconnected). Although FIG. 6 shows the adjacent driving electrodes TE coupled to each other by two first connection portions BE1, the number of first connection portions BE1 is not limited thereto.

The second connection portion BE2 is formed on the same layer as the sensing electrodes RE and may have a shape extending from the sensing electrodes RE. For example, the sensing electrodes RE and the second connection portion BE2 may be integrated. Accordingly, the sensing electrodes RE and the second connection portion BE2 may be simultaneously or concurrently formed with the same material during manufacturing processes. The sensing electrodes RE and the second connection portion BE2 may be arranged on the first sensor insulating film TINS1 (refer to FIG. 8).

Figure 7:
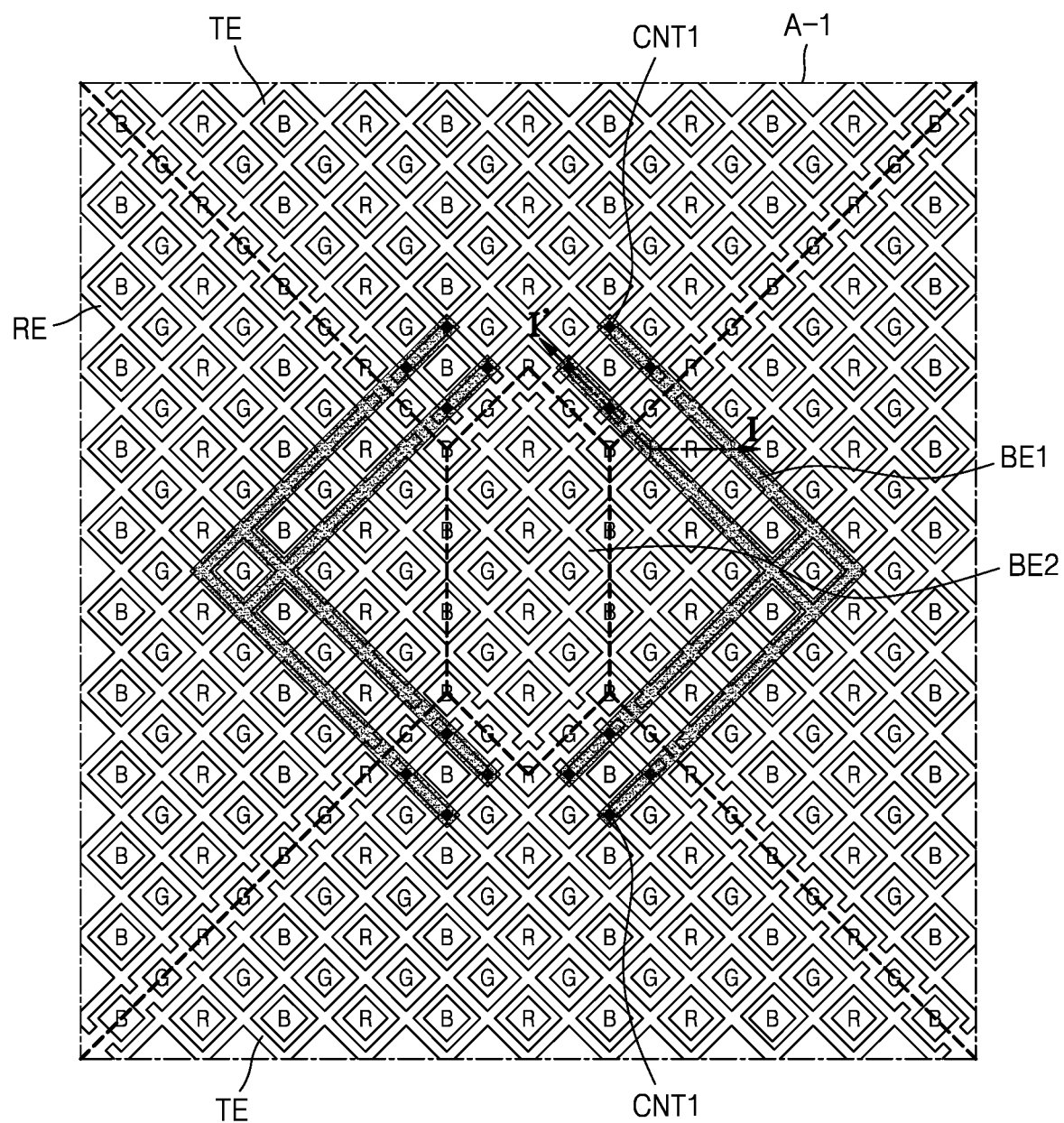
FIG. 7 is an enlarged plan view showing a portion of FIG. 6.
Figure 8:
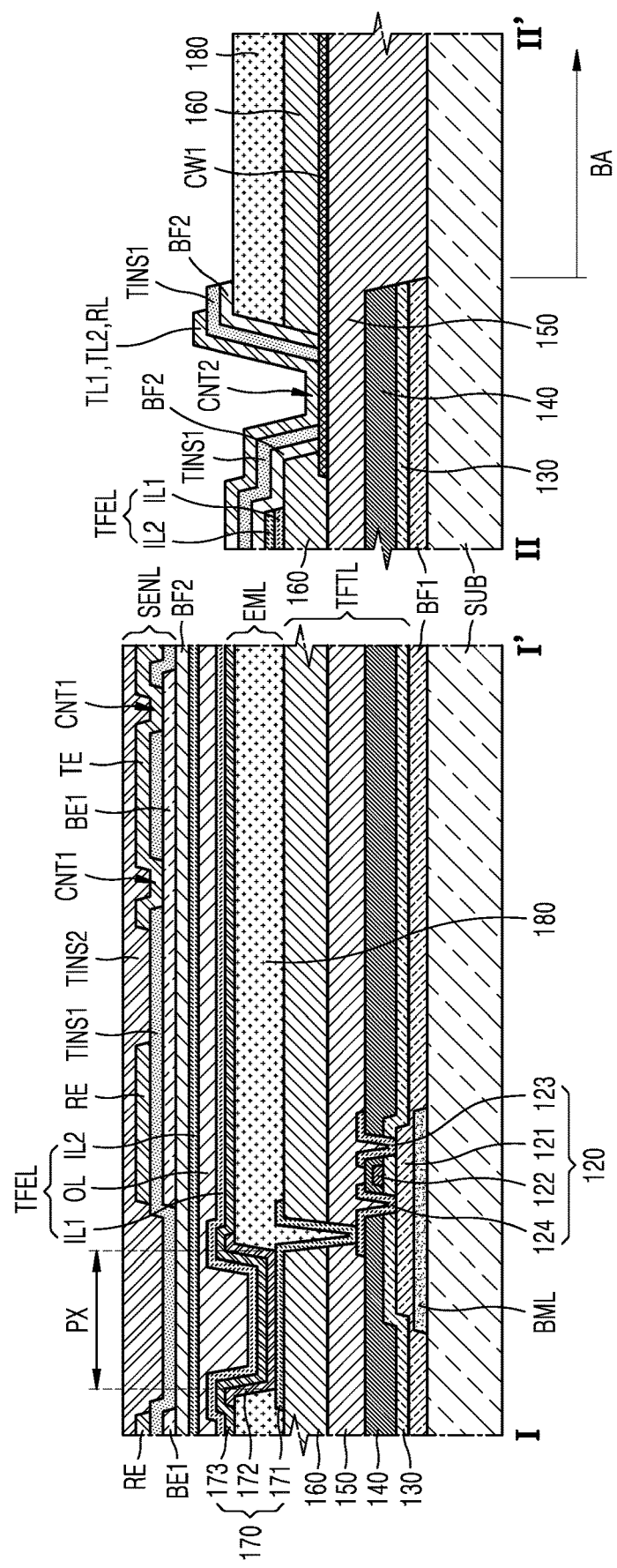
FIG. 8 is a cross-sectional view schematically showing a cross-section taken along line I-I' of FIG. 7 and a cross-section of a portion of FIG. 4.

As shown in FIG. 8, which is a cross-sectional view schematically showing a cross-section taken along line I-I' of FIG. 7 and a cross-section of a portion of FIG. 4, the first connection portions BE1 connecting the driving electrodes TE adjacent to each other in the second direction (y-axis direction) may be arranged on the second buffer film BF2. The driving electrodes TE, the sensing electrodes RE, the dummy patterns DE, and the second connection portion BE2 may be arranged on the first sensor insulating film TINS1. Thus, the driving electrodes TE and the sensing electrodes RE may be electrically separated from each other in their crossing regions, the sensing electrodes RE may be electrically coupled to each other in the first direction (x-axis direction), and the driving electrodes TE may be electrically coupled to each other in the second direction (y-axis direction).

FIG. 7 is an enlarged plan view showing the sensor electrodes and the connection portions of FIG. 6 in more detail. FIG. 7 is an enlarged view of area A-1 of FIG. 6.

As shown in FIG. 7, the driving electrodes TE, the sensing electrodes RE, the first connection portions BE1, and the second connection portion BE2 may appear to have a mesh structure in a plan view taken in a direction vertical to the substrate SUB. The dummy patterns DE may also appear to have a mesh structure in a plan view taken in a direction vertical to the substrate SUB. When the sensor electrode layer SENL including the driving electrodes TE and the sensing electrodes RE is directly on an encapsulation layer TFEL as shown in FIG. 8, a distance between the opposite electrode 173 (refer to FIG. 8) of a display element and the driving electrode TE of the sensor electrode layer SENL, or a distance between the opposite electrode 173 and the sensing electrode RE of the sensor electrode layer SENL, decreases. Accordingly, a parasitic capacitance between the opposite electrode 173 of a display element and the driving electrode TE of the sensor electrode layer SENL, or between the opposite electrode 173 of a display element and the sensing electrode RE of the sensor electrode layer SENL, may increase. The parasitic capacitance is proportional to an overlapping area between the opposite electrode 173 of a display element and the driving electrode TE of the sensor electrode layer SENL, or to an overlapping area between the opposite electrode 173 of a display element and the sensing electrode RE of the sensor electrode layer SENL. Accordingly, the driving electrodes TE and the sensing electrodes RE may appear to have a mesh structure in a plan view taken in a direction vertical to the substrate SUB to reduce a parasitic capacitance.

The driving electrodes TE, the sensing electrode RE, the dummy patterns DE, and the second connection portion BE2 are on the same layer as one another and thus may be arranged apart from one another (e.g., spaced apart from each other in a plan view). Gaps may be between the driving electrode TE and the sensing electrode RE, between the driving electrode TE and the second connection portion BE2, between the driving electrode TE and the dummy pattern DE, and between the sensing electrode RE and the dummy pattern DE. For convenience of description, FIG. 7 shows a boundary between the driving electrode TE and the sensing electrode RE, a boundary between the driving electrode TE and the second connection portion BE2, and a boundary between the sensing electrode RE and the second connection portion BE2 with a dashed line.

The first connection portion BE1 may be coupled to the driving electrodes TE through a first contact hole CNT1. One end of the first connection portion BE1 may be coupled to one driving electrode TE from among the driving electrodes TE adjacent to each other in the second direction (y-axis direction) through the first contact hole CNT1. The other end of the first connection portion BE1 may be coupled to another driving electrode TE from among the driving electrodes TE adjacent to each other in the second direction (y-axis direction) through the first contact hole CNT1. The first connection portion BE1 may overlap the driving electrodes TE and the sensing electrode RE. In some embodiments, the first connection portion BE1 may overlap the second connection portion BE2 instead of the sensing electrode RE. In some embodiments, the first connection portion BE1 may overlap both of the sensing electrode RE and the second connection portion BE2. The first connection portion BE1 is on a different layer from the driving electrodes TE, the sensing electrodes RE, and the second connection portion BE2. Thus, even when the first connection portion BE1 overlaps the sensing electrode RE and/or the second connection portion BE2, the first connection portion BE1 may not be short-circuited by the sensing electrode RE and/or the second connection portion BE2.

The second connection portion BE2 may be arranged between the sensing electrodes RE. The second connection portion BE2 is on the same layer as the sensing electrodes RE and may extend from each of the sensing electrodes RE. For example, the second connection portion BE2 may extend between two of the sensing electrodes RE adjacent in the first direction (x-axis direction) to connect the two sensing electrodes RE. Thus, the second connection portion BE2 may be coupled to the sensing electrodes RE without utilizing (e.g., without using) a contact hole to connect them. For example, the sensing electrodes RE and the second connection portion BE2 may be integrated (e.g., may be a single integrated part).

Sub-pixels R, G, and B may include a first sub-pixel R to emit light of a first color, a second sub-pixel G to emit light of a second color, and a third sub-pixel B to emit light of a third color. Although FIG. 7 illustrates that the first sub-pixel R is a first sub-pixel, the second sub-pixel G is a second sub-pixel, and the third sub-pixel B is a third sub-pixel, the disclosure is not limited thereto. Although FIG. 7 shows the first sub-pixel R, the second sub-pixel G, and the third sub-pixel B each having a planar shape of a quadrilateral in a plan view taken in a direction vertical to the substrate SUB, the disclosure is not limited thereto. For example, the first sub-pixel R, the second sub-pixel G, and the third sub-pixel B may have other planar shapes of a polygon, a circle, or an ellipse other than a quadrilateral. In addition, although FIG. 7 shows a size of the third sub-pixel B being the largest and a size of the second sub-pixel G being the smallest, the disclosure is not limited thereto.

A pixel refers to a group of sub-pixels capable of representing gradation. Although FIG. 7 shows the pixel including one first sub-pixel R, two second sub-pixels G, and one third sub-pixel B, the disclosure is not limited thereto. For example, the pixel may include one first sub-pixel R, one second sub-pixel G, and one third sub-pixel B.

The driving electrodes TE, the sensing electrodes RE, the dummy patterns DE, the first connection portions BE1, and the second connection portion BE2 may appear to have a mesh structure in a plan view taken in a direction vertical to the substrate SUB. Accordingly, the sub-pixels R, G, and B may not overlap the driving electrodes TE, the sensing electrodes RE, the dummy patterns DE, the first connection portions BE1 and/or the second connection portion BE2. As a result, brightness of light may be prevented from being reduced by light from the sub-pixels R, G, and B being shaded by the driving electrodes TE, the sensing electrodes RE, the dummy patterns DE, the first connection portions BE1 and/or the second connection portion BE2. In some embodiments, a reduction of the brightness of light from the sub-pixels R, G, and B, due to shading by the driving electrodes TE, the sensing electrodes RE, the dummy patterns DE, the first connection portions BE1 and/or the second connection portion BE2, may be reduced.

FIG. 8 is a cross-sectional view schematically showing a cross-section taken along line I-I' of FIG. 7 and a cross-section of a portion of the vicinity of the bending area BA of FIG. 4. Referring to FIG. 8, the display layer DISL including a first buffer film BF1, a thin film transistor layer TFTL, a light-emitting element layer EML, and the encapsulation layer TFEL may be arranged on the substrate SUB.

The first buffer film BF1 may be on a surface of the substrate SUB. The first buffer film BF1 may protect thin film transistors 120 and an intermediate layer 172 of the light-emitting element layer EML from moisture penetrating through the substrate SUB. The first buffer film BF1 may have a single-layer structure or a multilayer structure. For example, the first buffer film BF1 may have a multilayer structure in which one or more inorganic films from among a silicon nitride layer, a silicon oxynitride layer, a silicon oxide layer, a titanium oxide layer, and an aluminum oxide layer are alternately stacked. In some cases, the first buffer film BF1 may be omitted.

The thin film transistor layer TFTL arranged on the first buffer film BF1 may include the thin film transistors 120, a gate insulating film 130, an interlayer insulating film 140, a first planarization film 150, and a second planarization film 160.

A thin film transistor 120 includes an active layer 121, a gate electrode 122, a source electrode 123, and a drain electrode 124. Although FIG. 8 shows the thin film transistor 120 being of a top gate type (e.g., kind) in which the gate electrode 122 is above the active layer 121, the disclosure is not limited thereto. For example, in some embodiments, the thin film transistors 120 may adopt a bottom gate type (e.g., kind) in which the gate electrode 122 is below the active layer 121 or a double gate type (e.g., kind) in which the gate electrode 122 is above and below the active layer 121.

The active layer 121 is on the first buffer film BF1. The active layer 121 may include (e.g., be) polycrystalline silicon, single crystalline silicon, low-temperature polycrystalline silicon, amorphous silicon, and/or an oxide semiconductor. For example, the oxide semiconductor may include (e.g., be) a binary system compound (ABx), a ternary system compound (ABxCy), or a quaternary system compound (ABxCyDz) containing indium (In), zinc (Zn), gallium (Ga), tin (Sn), titanium (Ti), aluminum (Al), hafnium (Hf), zirconium (Zr), and/or magnesium (Mg). In some embodiments, the active layer 121 may include (e.g., be) ITZO (an oxide including indium, tin, and titanium) and/or IGZO (an oxide including indium, gallium, and tin). A light blocking layer BML may be arranged under the active layer 121, and the light blocking layer BML may have a single-layer structure or multilayer structure including (e.g., being) one of molybdenum (Mo), aluminum (Al), chromium (Cr), gold (Au), titanium (Ti), nickel (Ni), neodymium (Nd), and copper (Cu) or an alloy thereof.

The gate insulating film 130 may be on the active layer 121. The gate insulating film 130 may be an inorganic film including (e.g., being) silicon nitride, silicon oxynitride, silicon oxide, titanium oxide, and/or aluminum oxide.

The gate electrode 122 and a gate wire may be on the gate insulating film 130. The gate electrode 122 may overlap the active layer 121. The gate electrode 122 and the gate wire may have a single-layer structure or multilayer structure including (e.g., being) one of molybdenum (Mo), aluminum (Al), chromium (Cr), gold (Au), titanium (Ti), nickel (Ni), neodymium (Nd), and copper (Cu) or an alloy thereof.

The interlayer insulating film 140 may be on the gate electrode 122 and the gate wire. The interlayer insulating film 140 may be an inorganic film including (e.g., being) silicon nitride, silicon oxynitride, silicon oxide, titanium oxide, and/or aluminum oxide.

As shown in region II-II' of FIG. 8, the first buffer film BF1, the gate insulating film 130, and the interlayer insulating film 140 including (e.g., being) an inorganic material may not be in the bending area BA. Thus, the occurrence of a crack, etc. in the bending area BA during bending of a display panel may be effectively prevented or reduced. The first planarization film 150 and/or the second planarization film 160 described below includes (e.g., is) an organic material. Accordingly, even when the first planarization film 150 or the second planarization film 160 is in the bending area BA, the probability of cracking or the like is very low.

The source electrode 123 and the drain electrode 124 may be on the interlayer insulating film 140. Each of source electrode 123 and the drain electrode 124 may contact the active layer 121 through a contact hole defined in the interlayer insulating film 140. In some embodiments, each of the source electrode 123 and the drain electrode 124 may contact the active layer 121 through corresponding contact holes penetrating through the interlayer insulating film 140 and the gate insulating film 130. The source electrode 123 and the drain electrode 124 may have a single-layer structure or multilayer structure including (e.g., being) one of molybdenum (Mo), aluminum (Al), chromium (Cr), gold (Au), titanium (Ti), nickel (Ni), neodymium (Nd), and copper (Cu) or an alloy thereof.

The first planarization film 150 to planarize a step caused by the thin film transistor 120 may be on the source electrode 123 and the drain electrode 124. The first planarization film 150 may include (e.g., be) an insulating organic material such as acryl resin, epoxy resin, phenolic resin, polyamide resin, polyimide resin, etc.

The second planarization film 160 may be on the first planarization film 150. The second planarization film 160 may also include (e.g., be) an insulating organic material such as acryl resin, epoxy resin, phenolic resin, polyamide resin, polyimide resin, etc. If necessary, various wires including (e.g., being) a conductive material may be arranged between the first planarization film 150 and the second planarization film 160.

The light-emitting element layer EML is on the thin film transistor layer TFTL. The light-emitting element layer EML may include display elements 170 and a pixel-defining film 180. The display elements 170 and the pixel-defining film 180 may be on the second planarization film 160.

The display elements 170 may each be an organic light-emitting element as shown in FIG. 8. The organic light-emitting element may include a pixel electrode 171, the intermediate layer 172 including an emission layer, and the opposite electrode 173.

The pixel electrode 171 may be on the second planarization film 160. Although FIG. 8 shows the pixel electrode 171 coupled to the drain electrode 124 of the thin film transistor 120 through a contact hole defined in the first planarization film 150 and the second planarization film 160 to penetrate the first planarization film 150 and the second planarization film 160, the disclosure is not limited thereto. For example, there may be an intermediate conductive layer between the first planarization film 150 and the second planarization film 160. The intermediate conductive layer may be coupled to the drain electrode 124 of the thin film transistor 120 through a contact hole defined in the first planarization film 150 to penetrate through the first planarization film 150, and the pixel electrode 171 may be coupled to the intermediate conductive layer through a contact hole defined in the second planarization film 160 to penetrate through the second planarization film 160. In some embodiments, the pixel electrode 171 may be electrically coupled to the source electrode 123 instead of the drain electrode 124.

In a top emission display apparatus in which light is externally emitted through the opposite electrode 173 with respect to the intermediate layer 172 (e.g., from the intermediate layer 172) including the emission layer, the pixel electrode 171 may include (e.g., be) a reflective (e.g., highly reflective) metal material such as a stack structure of aluminum and titanium (Ti/Al/Ti), a stack structure of aluminum and ITO (ITO/Al/ITO), an APC alloy, and/or a stack structure of an APC alloy and indium tin oxide (ITO) (ITO/APC/ITO). The APC alloy is an alloy of silver (Ag), palladium (Pd) and/or copper (Cu).

In a bottom emission display apparatus in which light is externally emitted through the pixel electrode 171 with respect to the intermediate layer 172 (e.g., from the intermediate layer 172) including the emission layer, the pixel electrode 171 may include (e.g., be) a transparent conductive material (TCO), such as ITO and/or indium zinc oxide (IZO), suitably capable of transmitting light, or may include (e.g., be) a semi-transmissive conductive material such as magnesium (Mg), silver (Ag), or an alloy of magnesium (Mg) and silver (Ag).

The pixel-defining film 180 may cover an edge of each pixel electrode 171. The pixel-defining film 180 may include (e.g., be) an organic material such as acryl resin, epoxy resin, phenolic resin, polyamide resin, polyimide resin, etc.

The intermediate layer 172 including the emission layer is on the pixel electrode 171 and the pixel-defining film 180. The intermediate layer 172 may include a hole transporting layer or an electron transporting layer in addition to the emission layer. The emission layer included in the intermediate layer 172 may have a patterned shape corresponding to each pixel electrode 171 as shown in FIG. 8. The hole transporting layer and/or the electron transporting layer other than the emission layer may be patterned to correspond to each pixel electrode 171 or may have an integral shape with respect to a plurality of pixel electrodes 171. For example, the hole transporting layer and/or the electron transporting layer may be a common layer corresponding to some or all of the pixel electrodes 171. In some cases, the emission layer may also have an integral shape with respect to a plurality of pixel electrodes 171. In this case, a color filter or a quantum dot filter may be arranged on an optical path, and thus, full color display may be implemented. For example, the emission layer may be a common layer corresponding to some or all of the pixel electrodes 171, may be configured to emit light of one color (e.g., white light), and may include a plurality of color filters, each color filter being to receive the light of the one color (e.g., white light) and to emit light of another color (e.g., red, green, or blue light).

The opposite electrode 173 is on the intermediate layer 172 including the emission layer. A capping layer may be formed on the opposite electrode 173. In a top emission display apparatus, the opposite electrode 173 may include (e.g., be) a transparent conductive material (TCO), such as ITO and/or IZO, suitably capable of transmitting light, or may include (e.g., be) a semi-transmissive conductive material such as magnesium (Mg), silver (Ag), or an alloy of magnesium (Mg) and silver (Ag). In a bottom emission display apparatus, the opposite electrode 173 may include a reflective (e.g., highly reflective) metal material such as a stack structure of aluminum and titanium (Ti/Al/Ti), a stack structure of aluminum and ITO (ITO/Al/ITO), an APC alloy, and/or a stack structure of an APC alloy and ITO (ITO/APC/ITO). The APC alloy is an alloy of silver (Ag), palladium (Pd) and/or copper (Cu).

The encapsulation layer TFEL is on the light-emitting element layer EML, for example, on the opposite electrode 173. The encapsulation layer TFEL may include an inorganic film and an organic film and thus may prevent or block oxygen and/or moisture from penetrating into the intermediate layer 172 including the emission layer and into the opposite electrode 173. For example, the encapsulation layer TFEL may include a first inorganic film IL1 arranged on the opposite electrode 173, an organic film OL arranged on the first inorganic film IL1, and a second inorganic film IL2 arranged on the organic film OL. The first inorganic film IL1 and the second inorganic film IL2 may include (e.g., be) silicon nitride, silicon oxynitride, silicon oxide, titanium oxide, and/or aluminum oxide. The organic film OL may include (e.g., be) acryl resin, epoxy resin, phenolic resin, polyamide resin, and/or polyimide resin.

The encapsulation layer TFEL extends to the outside of a display area (e.g., the display area of the substrate SUB), and the first inorganic film IL1 and the second inorganic film IL2 may contact each other at the outside of the display area. FIG. 8 shows a thickness of the encapsulation layer TFEL in a portion of region II-II' being less than that of the encapsulation layer TFEL in region I-I'. FIG. 8 also shows, in region II-II' that there is no organic film OL between the first inorganic film IL1 and the second inorganic film IL2 of the encapsulation layer TFEL so that the first inorganic film IL1 and the second inorganic film IL2 may contact each other. As shown in the embodiment of FIG. 8, side surfaces of ends of the first inorganic film IL1 and the second inorganic film IL2 in region II-II' are not vertical (e.g., vertically aligned) but are inclined (e.g., aligned along an inclined surface) with respect to an upper surface of the substrate SUB.

The sensor electrode layer SENL is on the encapsulation layer TFEL. As described above, the sensor electrode layer SENL may include the second buffer film BF2, the driving electrodes TE, the sensing electrodes RE, the dummy patterns DE, the first connection portions BE1, the first driving wires TL1, the second driving wires TL2, the sensing wires RL, the guard wires GL1 to GL5, ground wires CRL1 to CRL3, the first sensor insulating film TINS1, and a second sensor insulating film TINS2. In FIG. 8, in region I-I', the second buffer film BF2, the driving electrode TE, the sensing electrode RE, the first connection portion BE1, the first sensor insulating film TINS1, and the second sensor insulating film TINS2 are shown. In FIG. 8, in region II-II' the second buffer film BF2, the first driving wires TL1, the second driving wires TL2, the sensing wires RL, and the first sensor insulating film TINS1 are shown.

The second buffer film BF2 may include (e.g., be) an inorganic film, for example, silicon nitride, silicon oxynitride, silicon oxide, titanium oxide, and/or aluminum oxide.

The first connection portions BE1 may be arranged on the second buffer film BF2. The first connection portions BE1 may overlap the pixel-defining film 180 when viewed in the third direction (z-axis direction). The first connection portions BE1 may have a stack structure of aluminum and titanium (Ti/Al/Ti), a stack structure of aluminum and ITO (ITO/Al/ITO), an APC alloy, and/or a stack structure of an APC alloy and ITO (ITO/APC/ITO). However, the disclosure is not limited thereto.

The first sensor insulating film TINS1 is on the first connection portions BE1. The first sensor insulating film TINS1 may include (e.g., be) an inorganic film, for example, silicon nitride, silicon oxynitride, silicon oxide, titanium oxide, and/or aluminum oxide. In some embodiments, the first sensor insulating film TINS1 may include (e.g., be) an insulating organic material such as acryl resin, epoxy resin, phenolic resin, polyamide resin, polyimide resin, etc.

The driving electrodes TE, the sensing electrodes RE, the dummy patterns DE, the second connection portions BE2, the first driving wires TL1, the second driving wires TL2, the sensing wires RL, the guard wires GL1 to GL5, and the ground wires GRL1 to GRL3 may be arranged on the first sensor insulating film TINS1. The driving electrodes TE, the sensing electrodes RE, the dummy patterns DE, and second connection portions BE2 may overlap the pixel-defining film 180 when viewed in the third direction (z-axis direction). The driving electrodes TE, the sensing electrodes RE, the dummy patterns DE, the second connection portions BE2, the first driving wires TL1, the second driving wires TL2, the sensing wires RL, the guard wires GL1 to GL5, and the ground wires GRL1 to GRL3 may have a stack structure of aluminum and titanium (Ti/Al/Ti), a stack structure of aluminum and ITO (ITO/Al/ITO), an APC alloy, and/or a stack structure of an APC alloy and ITO (ITO/APC/ITO). However, the disclosure is not limited thereto. The first driving wires TL1, the second driving wires TL2, and the sensing wires RL may be simultaneously or concurrently formed of the same material when the driving electrodes TE and the sensing electrodes RE are formed. For example, the first driving wires TL1, the second driving wires TL2, the sensing wires RL, the driving electrodes TE, and the sensing electrodes RE may be simultaneously or concurrently formed.

The first sensor insulating film TINS1 may have the first contact hole CNT1 defined in the first sensor insulating film TINS1 to penetrate through the first sensor insulating film TINS1 and to expose the first connection portions BE1. The driving electrodes TE may be coupled to the first connection portions BE1 through the first contact hole CNT1.

The second sensor insulating film TINS2 may be on the driving electrodes TE. The second sensor insulating film TINS2 may planarize a step of the sensor electrode layer SENL. The second sensor insulating film TINS2 may include (e.g., be) an inorganic film, for example, silicon nitride, silicon oxynitride, silicon oxide, titanium oxide, and/or aluminum oxide. In some embodiments, the second sensor insulating film TINS2 may include (e.g., be) an insulating organic material such as acryl resin, epoxy resin, phenolic resin, polyamide resin, polyimide resin, etc.

As shown in FIG. 8, the first connection portions BE1 connecting the driving electrodes TE adjacent to each other in the second direction (y-axis direction) may be arranged on the second buffer film BF2, and the driving electrodes TE, the sensing electrodes RE, and the second connection portion BE2 may be arranged on the first sensor insulating film TINS1. Thus, the driving electrodes TE and the sensing electrodes RE may be electrically separated from each other in their crossing regions, the sensing electrodes RE may be electrically coupled to each other in the first direction (x-axis direction), and the driving electrodes TE may be electrically coupled to each other in the second direction (y-axis direction).

As described above with reference to FIG. 4, the first driving wires TL1, the second driving wires TL2, and the sensing wires RL extend to (e.g., extend in) the sensor peripheral area TPA and are coupled to first sensor pads in the first sensor pad area TPA1 or to second sensor pads in the second sensor pad area TPA2. However, the first driving wires TL1, the second driving wires TL2, and the sensing wires RL are not directly coupled to the first sensor pads or to the second sensor pads. For example, as shown in FIG. 8, the first driving wires TL1, the second driving wires TL2 and/or the sensing wires RL may be coupled to first connection wires CW1 in the sensor peripheral area TPA, and the first connection wires CW1 may be coupled to the first sensor pads or to the second sensor pads.

A first connection wire CW1 may be between the first planarization film 150 and the second planarization film 160. The first connection wire CW1 may have a stack structure of aluminum and titanium (Ti/Al/Ti), a stack structure of aluminum and ITO (ITO/Al/ITO), an APC alloy, and/or a stack structure of an APC alloy and ITO (ITO/APC/ITO). However, the disclosure is not limited thereto. Because the first connection wire CW1 is between the first planarization film 150 and the second planarization film 160 including (e.g., being) an organic material, the occurrence of a crack, etc. in the first connection wire CW1 may be effectively prevented or reduced even when a display panel is bent in the bending area BA.

To connect the first driving wires TL1, the second driving wires TL2 and/or the sensing wires RL to the first connection wire CW1, a second contact hole CNT2 may be defined in the second planarization film 160, the second buffer film BF2, and the first sensor insulating film TINS1 to correspond to an end of the first connection wire CW1 facing the display area. For example, the second contact hole CNT2 may overlap the end of the first connection wire CW1.

During manufacturing processes, the encapsulation layer TFEL is formed after the second contact hole CNT2 is formed in the second planarization film 160. Accordingly, the encapsulation layer TFEL is formed in a set or preset region by utilizing a mask to not cover the second contact hole CNT2. However, due to a shadow effect of the mask, when a first inorganic film and a second inorganic film of the encapsulation layer TFEL are formed, a portion of materials for forming the first and second inorganic films are located in the second contact hole CNT2 defined in the second planarization film 160. When the portion of materials for forming the first and second inorganic films remains, the first driving wires TL1, the second driving wires TL2 and/or the sensing wires RL may not be properly coupled to the first connection wire CW1 later. Accordingly, a material for the encapsulation layer TFEL in the second contact hole CNT2 defined in the second planarization film 160 is removed by performing dry etching on an area of the second contact hole CNT2 after forming the encapsulation layer TFEL.

Figure 9:
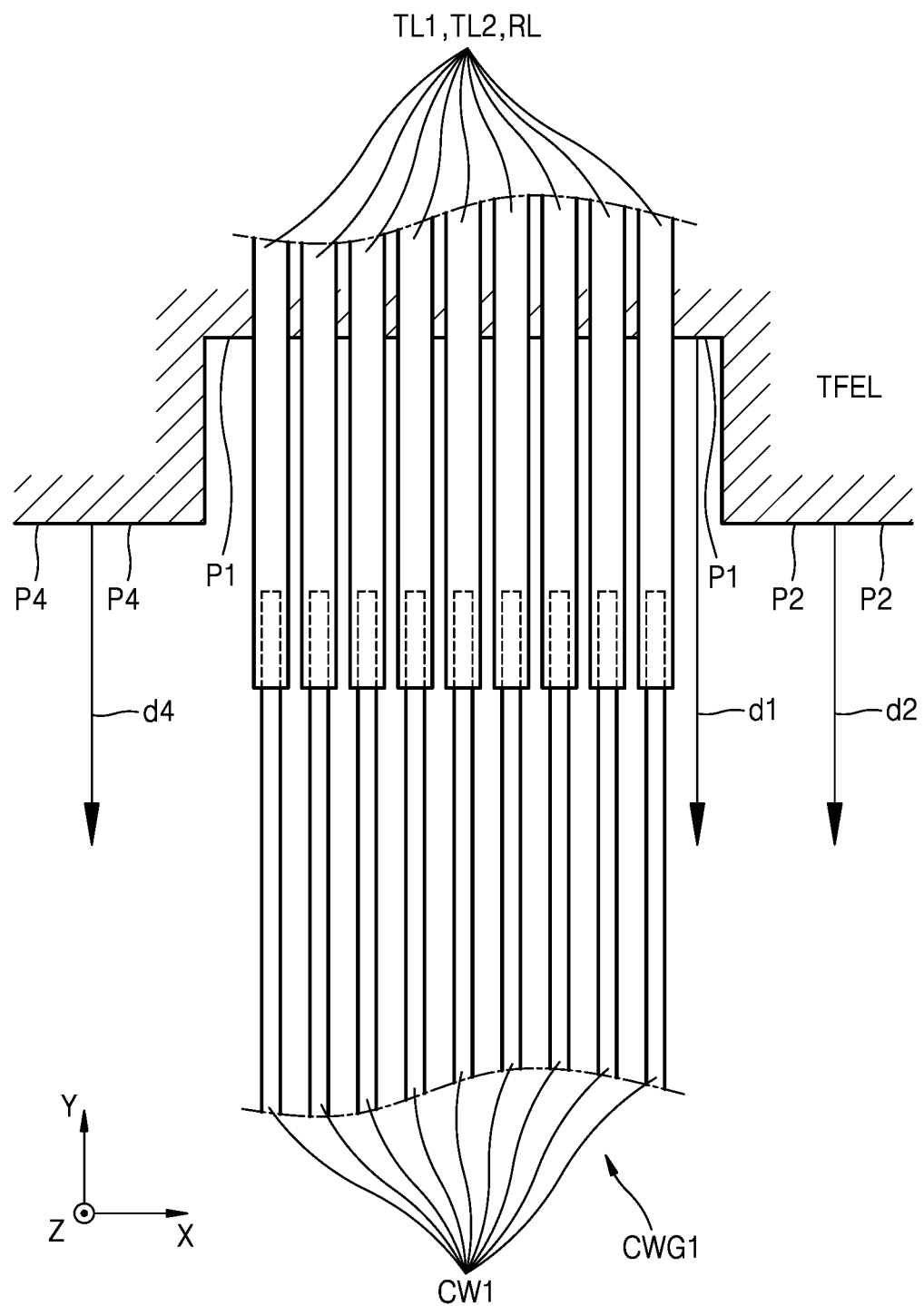
FIG. 9 is an enlarged plan view of a portion of the display apparatus of FIG. 1.

FIG. 9 is an enlarged plan view of a portion of the display apparatus 10 of FIG. 1, which is a portion corresponding to region II-II' of FIG. 8. As shown in FIG. 9, the first connection wires CW1 included in a first connection wire group extend toward a first edge of the substrate SUB. In this regard, the first edge of the substrate SUB may be, for example, as denoted by reference numeral EG1 in FIG. 4, an edge most adjacent to (e.g., closest to) the sensor pad areas TPA1 and TPA2 from among edges of the substrate SUB. Accordingly, the first connection wires CW1 are arranged between a display area and the first edge EG1 in a peripheral area.

A portion of the edge of the encapsulation layer TFEL facing (e.g., adjacent to or extending parallel with) the first edge EG1 has an uneven structure (e.g., an uneven shape) shown in FIG. 9 instead of having a substantially straight shape in the first direction (x-axis direction) in a plan view taken in a direction substantially vertical to the substrate SUB. For example, a first distance d1 from a first portion P1 of an end (e.g., edge or side) of the encapsulation layer TFEL facing the first edge EG1 (in the direction -y (negative y-axis direction)) to the first edge EG1, the first portion P1 corresponding to a first connection wire group CWG1, may be greater than a second distance d2 from a second portion P2 of the end of the encapsulation layer TFEL facing the first edge EG1 to the first edge EG1, the second portion P2 different from the first portion P1. In some embodiments, at least a portion of the first connection wire group CWG1 may overlap the encapsulation layer TFEL (e.g., may overlap a portion of the encapsulation layer TFEL corresponding to the first portion P1) and may extend in the second direction (y-axis direction) towards and past the first portion P1.

To reduce an area of dead space of a display apparatus, the second contact hole CNT2 connecting the first driving wires TL1, the second driving wires TL2 and/or the sensing wires RL and the first connection wire CW1 to each other may be located close to the display area. However, in this case, the second contact hole CNT2 becomes close to an end of the encapsulation layer TFEL. As a result, when a first inorganic film (e.g., the first inorganic film IL1) and a second inorganic film (e.g., the second inorganic film IL2) of the encapsulation layer TFEL are formed, a larger amount of materials for forming the first and second inorganic films are located in the second contact hole CNT2 defined in the second planarization film 160. Accordingly, the time required for dry etching to remove such materials increases, which may cause a decrease in manufacturing speed. Also, when dry etching is performed for a long time, an amount of heat generated during the process increases, and thus, a problem such as damage to the intermediate layer 172 including the emission layer may occur.

However, in a display apparatus according to the present embodiment, as shown in FIG. 9, the first distance d1 from the first portion P1 of the end of the encapsulation layer TFEL facing the first edge EG1 (in the direction -y) to the first edge EG1, the first portion P1 corresponding to the first connection wire group CWG1, may be greater than the second distance d2 from the second portion P2 of the end of the encapsulation layer TFEL facing the first edge EG1 to the first edge EG1, the second portion P2 different from the first portion P1. Thus, even when second contact holes CNT2 located in a place where the first driving wires TL1, the second driving wires TL2 and/or the sensing wires RL and the first connection wires CW1 overlap each other are closer to the display area compared to a display apparatus of the related art, a distance between the first portion P1 of the encapsulation layer TFEL and the second contact hole CNT2 may be sufficiently maintained. For example, the distance between the first portion P1 of the encapsulation layer TFEL and the second contact hole CNT2 may be sufficiently large enough to prevent a substantial amount of material from the material utilized to form the encapsulation layer TFEL (e.g., material used to form the first inorganic film and/or the second inorganic film) to be located in (e.g., from spilling into) the contact hole CNT2 during a process of forming the encapsulation layer TFEL. Accordingly, a material utilized to form the encapsulation layer TFEL may be blocked or prevented from being located in the second contact hole CNT2 due to a shadow effect. Even when a material utilized to form the encapsulation layer TFEL is located in the second contact hole CNT2 due to a shadow effect, an amount thereof may be blocked or reduced.

Figure 10:
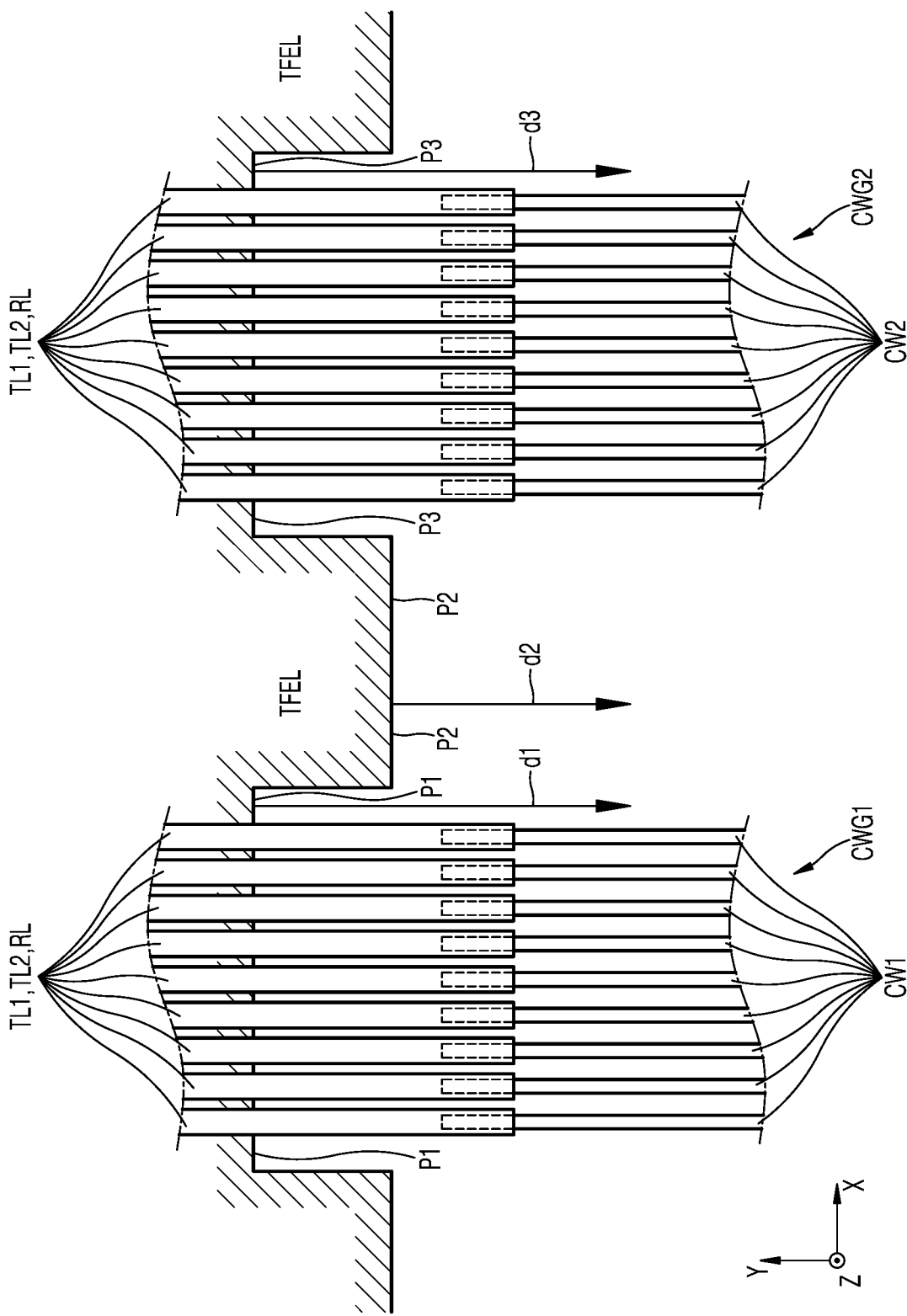
FIG. 10 is an enlarged plan view of a portion of a display apparatus according to another embodiment.

FIG. 10 is an enlarged plan view of a portion of a display apparatus according to another embodiment. The display apparatus according to the present embodiment further includes a second connection wire group CWG2 including second connection wires CW2 in addition to the first connection wire group CWG1 including the first connection wires CW1. The second connection wire group CWG2 is also located in a peripheral area to be located between a display area and the first edge EG1. In addition, the second connection wire group CWG2 is spaced apart (e.g., spaced apart in the first direction (x-axis direction)) from the first connection wire group CWG1.

In this regard, a third distance d3 from a third portion P3 of an end of the encapsulation layer TFEL facing the first edge EG1 (in the direction -y) to the first edge EG1, the third portion P3 corresponding to the second connection wire group CWG2, is greater than the second distance d2. For example, the third distance d3 may be substantially equal to the first distance d1, but the disclosure is not limited thereto. Thus, even when the second contact holes CNT2 located in a place where the first driving wires TL1, the second driving wires TL2 and/or the sensing wires RL and the second connection wires CW2 overlap each other are closer to the display area compared to a display apparatus of the related art, a distance between the third portion P3 of the encapsulation layer TFEL and the second contact hole CNT2 (e.g., the second contact holes CNT2 corresponding to the second connection wire group CWG2) may be sufficiently maintained. Accordingly, a material utilized to form the encapsulation layer TFEL may be blocked or prevented from being located in the second contact hole CNT2 due to a shadow effect. Even when a material utilized to form the encapsulation layer TFEL is located in the second contact hole CNT2 due to a shadow effect, an amount thereof may be blocked or reduced.

As shown in FIG. 10, the second portion P2 of the encapsulation layer TFEL may be between the first portion P1 and the third portion P3. Thus, in the second portion P2, the encapsulation layer TFEL may sufficiently extend toward the first edge EG1 of the substrate SUB, thereby protecting a display element, etc. of the display area. For example, the second portion P2 of the end of the encapsulation layer TFEL facing the first edge EG1 may protrude towards the first edge EG1 of the substrate SUB and away from the first portion P1 and the third portion P3 of the end of the encapsulation layer TFEL facing the first edge EG1.

Figure 11:
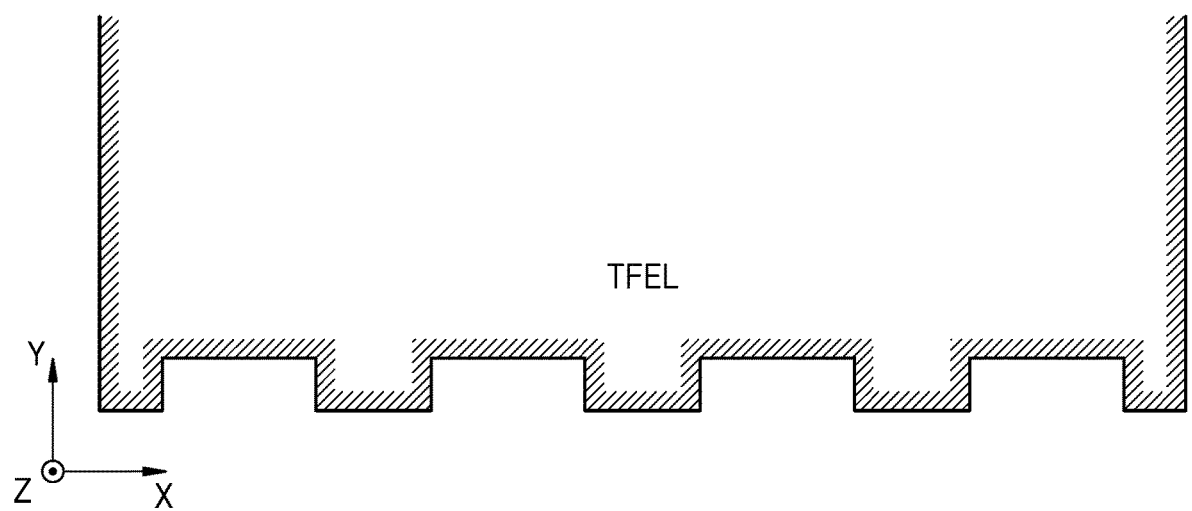
FIG. 11 is a plan view of a portion of the display apparatus of FIG. 10.

Connection wires for connecting the first driving wires TL1, the second driving wires TL2 and/or the sensing wires RL to the sensor pad areas TPA1 and TPA2 may be divided into a plurality of groups. For example, although FIG. 10 shows only the two groups, the first connection wire group CWG1 and the second connection wire group CWG2, more groups may be present. In this case, in a plan view taken in a direction vertical to the substrate SUB, an end of the encapsulation layer TFEL facing the first edge EG1 may have a plurality of uneven structures as shown in FIG. 11.

Figure 12:
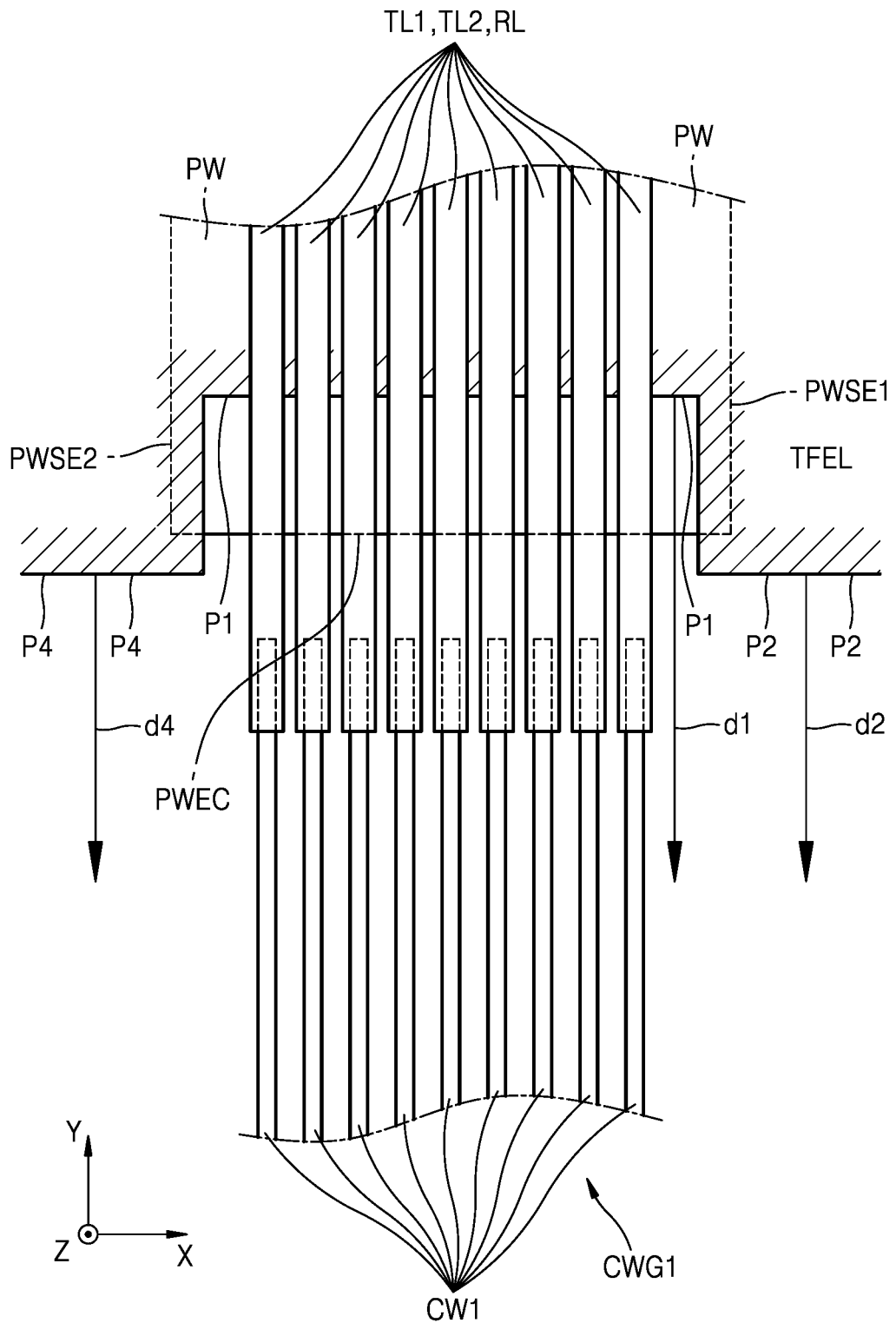
FIG. 12 is an enlarged plan view of a portion of a display apparatus according to another embodiment.

FIG. 12 is an enlarged plan view of a portion of a display apparatus according to another embodiment. As described above, the first distance d1 from the first portion P1 of an end of the encapsulation layer TFEL facing the first edge EG1 (in the direction −y) to the first edge EG1, the first portion P1 corresponding to the first connection wire group CWG1, may be greater than the second distance d2 from the second portion P2 of the end of the encapsulation layer TFEL facing the first edge EG1 to the first edge EG1, the second portion P2 different from the first portion P1. In addition, as shown in FIG. 12, a fourth portion P4 of the end of the encapsulation layer TFEL facing the first edge EG1, the fourth portion P4 different from the first portion P1 and the second portion P2 is arranged to face away from the second portion P2 such that the first portion P1 is between the second portion P2 and the fourth portion P4. In some embodiments, the fourth portion P4 and the second portion P2 face toward the first edge EG1, and the fourth portion P4 and the second portion P2 may be spaced apart (e.g., spaced apart in the first direction (x-axis direction)) from each other in a plan view with the first portion P1 between the fourth portion P4 and the second portion P2. In some embodiments, the first portion P1 of the end of the encapsulation layer TFEL facing the first edge EG1 may recede away from (e.g., may be indented away from) the second portion P2 and the fourth portion P4 of the end of the encapsulation layer TFEL facing the first edge EG1. The first distance d1 may be greater than a fourth distance d4 from the fourth portion P4 to the first edge EG1. In this regard, the fourth distance d4 may be the same as the second distance d2.

The display apparatus may further include a wire PW shown in FIG. 12. The wire PW may extend from within a display area to a portion between the display area and the first edge EG1 and thus may be directed to (e.g., extend towards) the first connection wire group CWG1. For example, at least a portion of the wire PW may extend towards the first connection wire group CWG1 to overlap at least a portion of the first connection wire group CWG1, and the portion of the wire PW may extend in substantially the same direction as the portion of the first connection wire group CWG1. However, the wire PW is not coupled to the first connection wire group CWG1. The wire PW may be on the same layer as the first connection wire CW1.

A center portion PWEC of an end of the wire PW facing the first connection wire group CWG1 may be exposed to the outside of the first portion P1 of the encapsulation layer TFEL. In this regard, a first side end PWSE1 of the wire PW coupled to the end of the wire PW may be covered by (e.g., may overlap) the second portion P2 of the encapsulation layer TFEL, and a second side end PWSE2 of the wire PW coupled to the end of the wire PW may be covered by (e.g., may overlap) the fourth portion P4 of the encapsulation layer TFEL. For example, the end of the wire PW facing the first connection group CWG1 may extend substantially along the first direction (x-axis direction) in the plan view, and the first and second side ends PWSE1 and PWSE2 of the wire PW may extend along the second direction (y-axis direction) in a plan view to be coupled to the end of the wire PW facing the first connection group CWG1. In some embodiments, at least a portion of the wire PW may overlap the encapsulation layer TFEL and may extend towards the end of the encapsulation layer TFEL facing the first edge EG1 such that the wire PW extends past the first portion P1 of the encapsulation layer TFEL and does not extend past the second and fourth portions P2 and P4 of the encapsulation layer TFEL. Thus, the center portion PWEC of the end of the wire PW facing the first connection group CWG1 may not overlap the encapsulation layer TFEL, and the first and second side ends PWSE1 and PWSE2 may overlap the encapsulation layer TFEL.

Figure 13:
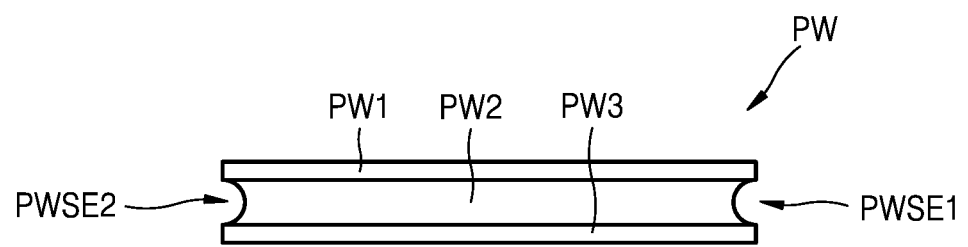
FIG. 13 is a schematic cross-sectional view of a wire of FIG. 12.

FIG. 13 is a schematic cross-sectional view of the wire PW of FIG. 12. As described above, the wire PW may be on the same layer as the first connection wire CW1. Thus, the wire PW may have a stack structure of aluminum and titanium (Ti/Al/Ti), a stack structure of aluminum and ITO (ITO/Al/ITO), an APC alloy, and a stack structure of an APC alloy and ITO (ITO/APC/ITO). FIG. 13 is a cross-sectional view of the wire PW having a three-layer structure.

As shown in FIG. 13, edges of the wire PW having a multilayer structure may have different shapes for each layer. For example, as shown in FIG. 13, the wire PW may have a shape in which the edge of an intermediate layer PW2 is inwardly indented compared to the edge of an upper layer PW1 and/or the edge of a lower layer PW3.

For example, the intermediate layer PW2 may include (e.g., be) aluminum, and the upper layer PW1 and the lower layer PW3 may include (e.g., be) titanium. Because a strength of aluminum is usually less than that of titanium, for example, an etching rate of aluminum is usually higher than that of titanium, the intermediate layer PW2 including (e.g., being) aluminum may be overly etched compared to the upper layer PW1 and the lower layer PW3 including (e.g., being) titanium during a process of forming and patterning a conductive layer to form the wire PW. However, the disclosure is not limited thereto.

Thus, the wire PW may have a cross-sectional shape shown in FIG. 13. For example, when viewed in a direction vertical to the substrate SUB, an area of the intermediate layer PW2 of the wire PW may be smaller than that of the upper layer PW1, which is an uppermost layer of the wire PW. In this case, when the edge of the wire PW is not covered by an insulating material having a sufficient thickness, a penetration path where external impurities penetrate into a display area along the edge of the intermediate layer PW2 may be generated.

However, in the display apparatus according to the present embodiment, as shown in FIG. 12, the first side end PWSE1 coupled to the end of the wire PW is covered by the second portion P2 of the encapsulation layer TFEL, and the second side end PWSE2 coupled to the end of the wire PW is covered by the fourth portion P4 of the encapsulation layer TFEL. Thus, the first side end PWSE1 and the second side end PWSE2 of the wire PW may be covered by an insulating film having a sufficient thickness. As a result, external impurities may be effectively prevented or blocked from penetrating into the display area through the first side end PWSE1 and the second side end PWSE2 of the wire PW.

Figure 14:
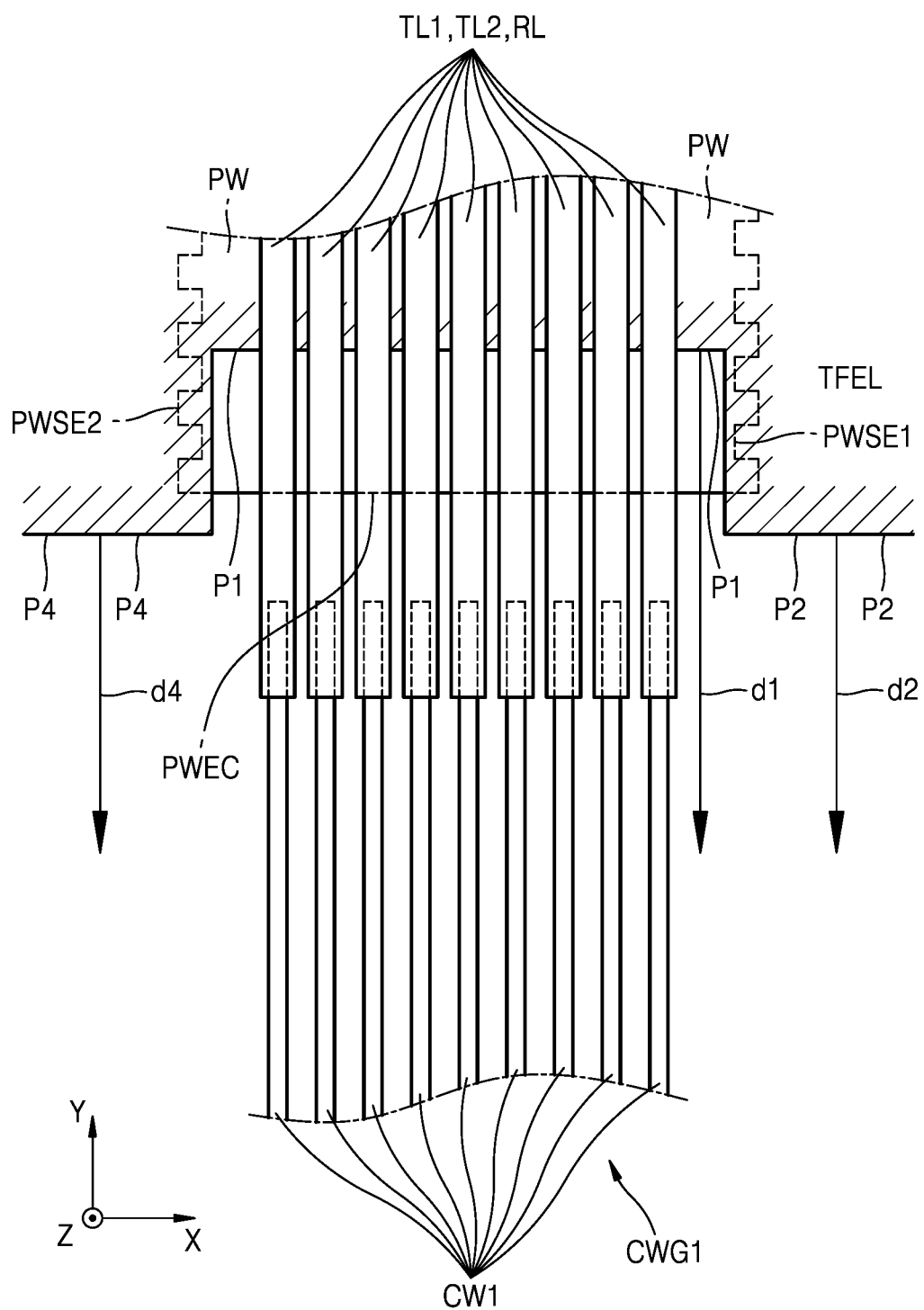
FIG. 14 is an enlarged plan view of a portion of a display apparatus according to another embodiment.

Further, as shown in FIG. 14, which is an enlarged plan view of a portion of a display apparatus according to another embodiment, when viewed in a direction vertical to the substrate SUB, the first side end PWSE1 of the wire PW may include a portion having an uneven shape. The second side end PWSE2 of the wire PW may also include a portion having an uneven shape. For example, the first side end PWSE1 and/or the second side end PWSE2 of the wire PW may have one or more protrusions and/or recessions (e.g., indents). Thus, even when external impurities penetrate through the first side end PWSE1 or the second side end PWSE2 of the wire PW, a length of a penetration path leading to a display area may increase, thereby effectively reducing the possibility of damage to the display area. A portion of the first side end PWSE1 of the wire PW having an uneven shape may be covered by the second portion P2 of the encapsulation layer TFEL, and a portion of the second side end PWSE2 of the wire PW having an uneven shape may be covered by the fourth portion P4 of the encapsulation layer TFEL.

The wire PW may be an electrode power supply line called an ELVSS line, which is electrically coupled to the opposite electrode 173 arranged in the display area. In some embodiments, the wire PW may be a power supply line called an ELVDD line, which is electrically coupled to pixel circuits including the thin film transistor 120, etc. arranged in the display area and electrically coupled to display elements.

Figure 15:
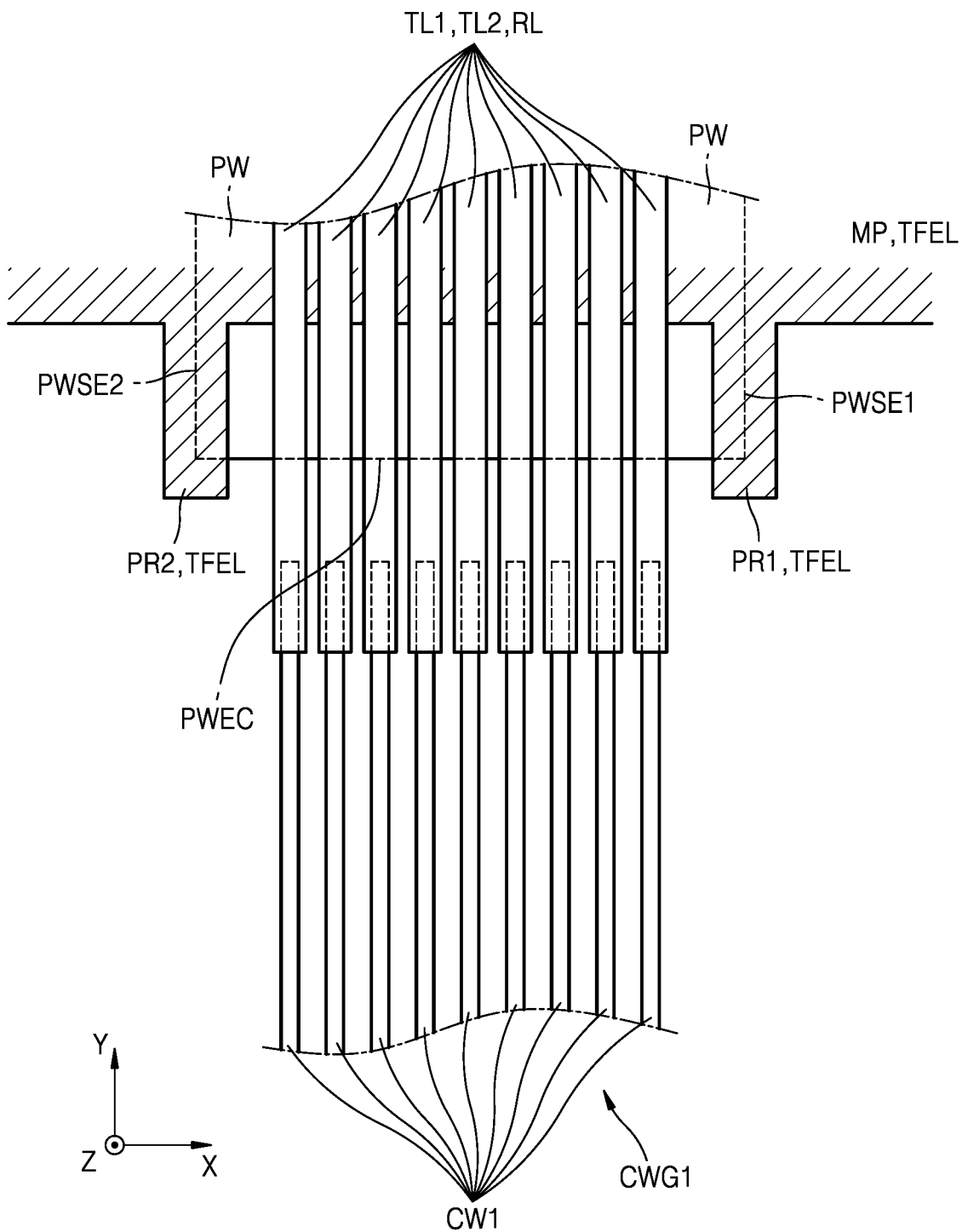
FIG. 15 is an enlarged plan view of a portion of a display apparatus according to another embodiment.

FIG. 15 is an enlarged plan view of a portion of a display apparatus according to another embodiment.

The display apparatus according to the present embodiment is different from the display apparatus described above with reference to FIG. 12 in terms of a shape of the encapsulation layer TFEL. The encapsulation layer TFEL included in the display apparatus according to the present embodiment has a main portion MP, a first protrusion PR1, and a second protrusion PR2. The main portion MP covers display elements, for example, a display area. The first protrusion PR1 is a portion protruding from the main portion MP to cover the first side end PWSE1 of the wire PW coupled to an end of the wire PW facing the first connection wire group CWG1. The second protrusion PR2 is also a portion protruding from the main portion MP to cover the second side end PWSE2 of the wire PW coupled to the end of the wire PW facing the first connection wire group CWG1.

In the display apparatus according to the present embodiment, as shown in FIG. 15, the first side end PWSE1 of the wire PW coupled to the end of the wire PW is covered by the first protrusion PR1 of the encapsulation layer TFEL, and the second side end PWSE2 of the wire PW coupled to the end of the wire PW is covered by the second protrusion PR2 of the encapsulation layer TFEL. Accordingly, the first side end PWSE1 and the second side end PWSE2 of the wire PW may be covered by an insulating film having a sufficient thickness. As a result, external impurities may be effectively prevented or blocked from penetrating into the display area through the first side end PWSE1 and the second side end PWSE2 of the wire PW.

As a modified example according to the present embodiment, in a plan view taken in a direction vertical to the substrate SUB, the first side end PWSE1 of the wire PW may include a portion having an uneven shape. The second side end PWSE2 of the wire PW may also include a portion having an uneven shape. Thus, even when external impurities penetrate through the first side end PWSE1 or the second side end PWSE2 of the wire PW, a length of a penetration path leading to a display area may increase, thereby effectively reducing the possibility of damage to the display area. A portion of the first side end PWSE1 of the wire PW having an uneven shape is covered by the first protrusion PR1 of the encapsulation layer TFEL, and a portion of the second side end PWSE2 of the wire PW having an uneven shape is covered by the second protrusion PR2 of the encapsulation layer TFEL.

The wire PW may be an electrode power supply line called an ELVSS line, which is electrically coupled to the opposite electrode 173 arranged in the display area. In some embodiments, the wire PW may be a power supply line called an ELVDD line, which is electrically coupled to pixel circuits including the thin film transistor 120, etc. arranged in the display area and electrically coupled to display elements.

Figure 16:
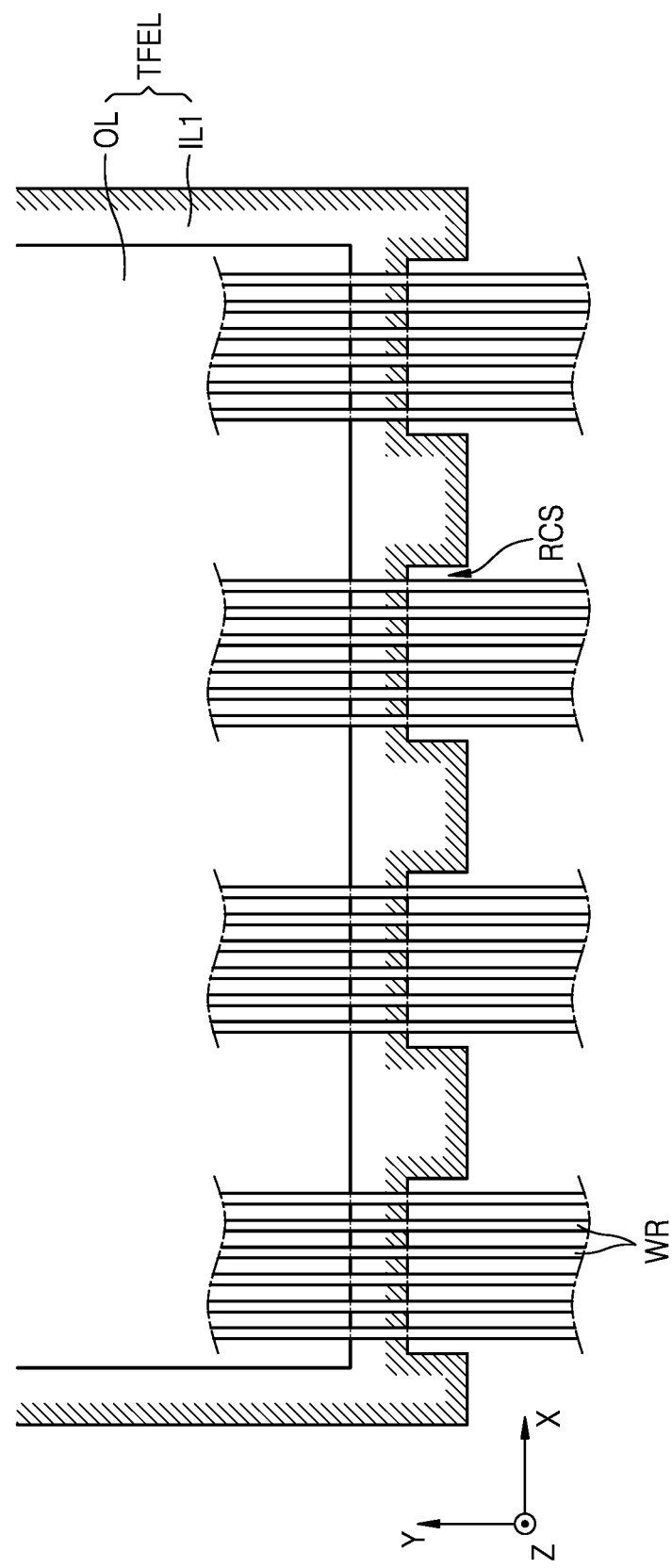
FIG. 16 is a plan view of a portion of a display apparatus according to another embodiment.

FIG. 16 is a schematic plan view of a portion of a display apparatus according to another embodiment.

According to another embodiment, a display apparatus may include the substrate SUB having a display area and a peripheral area outside the display area, display elements arranged at (e.g., on or in) the display area of the substrate SUB, and the encapsulation layer TFEL covering the display elements. The encapsulation layer TFEL may include the first inorganic film IL1. As shown in FIG. 16, when viewed in a direction vertical to the substrate SUB, the first inorganic film IL1 has at least one recess RCS at an edge corresponding to (e.g., facing) a first edge of the substrate SUB. The at least one recess RCS may be recessed toward a display area (in a direction +y).

In this regard, the first edge of the substrate SUB may be the first edge described above with reference to FIG. 4. For example, as denoted by reference numeral EG1 in FIG. 4, the first edge may be an edge most adjacent to the sensor pad areas TPA1 and TPA2 from among edges of the substrate SUB.

In addition to the first inorganic film IL1, the encapsulation layer TFEL may include the organic film OL arranged on the first inorganic film IL1. In this regard, a shape of an edge of the organic film OL may be different from that of an edge of the first inorganic film IL1. For example, an edge of the organic film OL corresponding to the edge of the first inorganic film IL1 having the at least one recess RCS may have a substantially straight shape as shown in FIG. 16. In some embodiments, the edge of the organic film OL corresponding to the edge of the first inorganic film IL1 having the at least one recess RCS may have a shape corresponding to that of the first edge of the substrate SUB.

When the organic film OL of the encapsulation layer TFEL is formed, a dam defining an outer edge of the organic film OL may be formed. The dam may be, for example, a protruding portion of the first inorganic film IL1 arranged under the organic film OL. Accordingly, when the organic film OL is formed, a material for forming the organic film OL fails to run over, or may be blocked from running over, the protruding dam. Thus, the edge of the organic film OL may correspond to a location of the dam. The dam may be formed as the first inorganic film IL1 itself protrudes or may be formed as a layer arranged under the first inorganic film IL1 protrudes and the first inorganic film IL1 covers the layer. For example, the dam may be formed by forming the first inorganic film IL1 to include a protruding portion having a thickness greater than that of other portions of the first inorganic film IL1 to define the dam. In some embodiments, a protruding layer may be formed under the first inorganic film IL1 to be covered by the first inorganic film IL1 and to cause the first inorganic film IL1 to protrude in a thickness direction (e.g., z-axis direction) to define the dam. In FIG. 16, a shape of the edge of the organic film OL formed by such a dam substantially corresponds to that of the display area.

Figure 17:
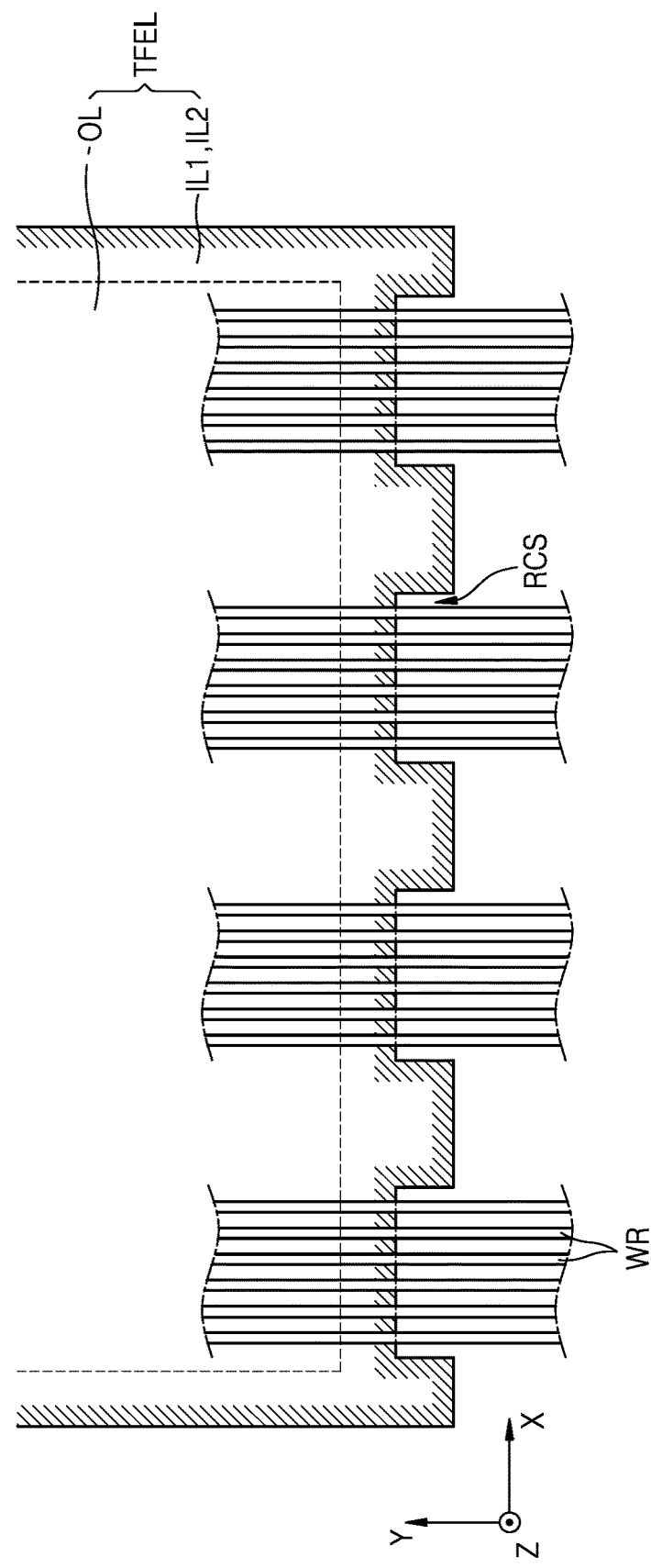
FIG. 17 is a plan view of a portion of a display apparatus according to another embodiment.

Further, as shown in FIG. 17, which is a schematic plan view of a portion of a display apparatus according to another embodiment, the encapsulation layer TFEL may further include the second inorganic film IL2 arranged on the organic film OL. In this case, the organic film OL is between the first inorganic film IL1 and the second inorganic film IL2. The first inorganic film IL1 and the second inorganic film IL2 may contact each other at the outside of the organic film OL. In this regard, a shape of an edge of the second inorganic film IL2 may be similar to that of an edge of the first inorganic film IL1. For example, an edge of the second inorganic film IL2 corresponding to an edge of the first inorganic film IL1 having the at least one recess RCS may have a shape corresponding to that of the edge of the first inorganic film IL1 having the at least one recess RCS.

During manufacturing processes, the first inorganic film IL1 and the second inorganic film IL2 may be formed by utilizing the same mask. Accordingly, a shape of the edge of the second inorganic film IL2 may correspond to that of the edge of the first inorganic film IL1. However, due to process errors, etc., the edge of the first inorganic film IL1 and the edge of the second inorganic film IL2 may not be perfectly matched.

FIGS. 16 and 17 show an edge of the first inorganic film IL1 facing the first edge of the substrate SUB, for example, the edge of the first inorganic film IL1 having recesses RCS, from among edges of the first inorganic film IL1. FIGS. 16 and 17 also show a portion of edges coupled to the edge, from among edges of the first inorganic film IL1 of the encapsulation layer TFEL. However, the disclosure is not limited thereto. For example, the substrate SUB may have a second edge opposite to the first edge with respect to a center of the display area. In this regard, when viewed in a direction vertical to the substrate SUB, the first inorganic film IL1 may have at least one recess even at an edge corresponding to the second edge of the substrate SUB. The second inorganic film IL2 may also have at least one recess even at an edge corresponding to the second edge of the substrate SUB.

The sensor electrode layer SENL (refer to FIG. 2, FIG. 4 and/or FIG. 8) having the sensor area TSA and the sensor peripheral area TPA outside the sensor area TSA may be on the encapsulation layer TFEL. In this regard, as shown in FIGS. 16 and 17, wires WR may extend from the sensor peripheral area TPA to the outside of the first inorganic film IL1. The wires WR may be directed to (e.g., extend toward) the first edge of the substrate SUB. In this regard, when viewed in a direction vertical to the substrate SUB, the wires WR may overlap the at least one recess RCS. FIG. 9 or FIG. 10 may be an enlarged view of some of the recesses RCS shown in FIG. 16 or FIG. 17. For example, the wires WR may include the sensor wires TL1, TL2, and RL extending from the sensor peripheral area TPA to the outside of the first inorganic film IL1 and the first connection wires CW1 electrically coupled to the sensor wires TL1, TL2, and RL. The sensor wires TL1, TL2, and RL and the first connection wires CW1 may be electrically coupled to each other through the second contact holes CNT2 (refer to FIG. 8) defined in an insulating layer between the sensor wires TL1, TL2, and RL and the first connection wires CW1.

According to one or more of the embodiments described above, a display apparatus in which dead space may be reduced and a failure rate may be decreased may be implemented. However, the disclosure is not limited by such an aspect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims and equivalents thereof.

What is claimed is:

1. A display apparatus comprising:
    a substrate comprising a display area and a peripheral area outside the display area;
    display elements arranged at the display area of the substrate;
    an encapsulation layer covering the display elements;
    a sensor electrode layer arranged over the encapsulation layer;
    a first connection wire group arranged in the peripheral area to be arranged between the display area and a first edge of the substrate, arranged outside the encapsulation layer, and comprising first connection wires; and
    a wire extending from within the display area to a portion between the display area and the first edge to face the first connection wire group,
    wherein a first distance from a first portion of an end of the encapsulation layer facing the first edge to the first edge is greater than a second distance from a second portion of the end of the encapsulation layer facing the first edge to the first edge, and
    wherein the first portion corresponds to the first connection wire group, and the second portion is different from the first portion.

2. The display apparatus of claim 1, further comprising a second connection wire group arranged in the peripheral area to be arranged between the display area and the first edge, comprising second connection wires, and spaced apart from the first connection wire group,
    wherein a third distance from a third portion of the end of the encapsulation layer facing the first edge to the first edge is greater than the second distance, and
    wherein the third portion corresponds to the second connection wire group.

3. The display apparatus of claim 2, wherein the second portion is between the first portion and the third portion.

4. The display apparatus of claim 1, wherein, when viewed in a plan view of the substrate, the end of the encapsulation layer facing the first edge comprises an uneven structure.

5. The display apparatus of claim 1,
    wherein a fourth portion of the end of the encapsulation layer facing the first edge is different from the first portion and the second portion, and is spaced apart from the second portion while the first portion is between the second portion and the fourth portion, and wherein the first distance is greater than a fourth distance from the fourth portion to the first edge.

6. The display apparatus of claim 5, wherein the fourth distance is the same as the second distance.

7. The display apparatus of claim 5, wherein a center portion of an end of the wire facing the first connection wire group is exposed to the outside of the first portion, and wherein a first side end of the wire coupled to the end of the wire is covered by the second portion, and a second side end of the wire coupled to the end of the wire is covered by the fourth portion.

8. The display apparatus of claim 7, wherein, when viewed in a plan view of the substrate, the first side end comprises a portion having an uneven shape.

9. The display apparatus of claim 7, wherein, when viewed in a plan view of the substrate, the second side end comprises a portion having an uneven shape.

10. The display apparatus of claim 7, wherein the first connection wires and the wire are arranged on the same layer.

11. The display apparatus of claim 7, wherein the wire comprises a three-layer structure.

12. The display apparatus of claim 11, wherein strengths of a lowermost layer and an uppermost layer of the wire are each greater than a strength of an intermediate layer of the wire.

13. The display apparatus of claim 11, wherein an area of an intermediate layer of the wire is smaller than that of an uppermost layer of the wire, when viewed in a plan view of the substrate.

14. The display apparatus of claim 7, wherein the display elements comprise pixel electrodes and an opposite electrode arranged over the pixel electrodes and corresponding to the pixel electrodes, and wherein the wire is an electrode power supply line electrically coupled to the opposite electrode.

15. The display apparatus of claim 7, further comprising pixel circuits arranged in the display area and electrically coupled to the display elements, wherein the wire is a power supply line electrically coupled to the pixel circuits.

16. The display apparatus of claim 1, further comprising sensor wires configured to electrically connect the sensor electrode layer to the first connection wires.

17. The display apparatus of claim 16, wherein the sensor wires are electrically coupled to ends of the first connection wires facing the display area.

18. A display apparatus comprising:

a substrate comprising a display area and a peripheral area outside the display area;

display elements arranged at the display area of the substrate;

an encapsulation layer covering the display elements;

a sensor electrode layer arranged over the encapsulation layer;

a first connection wire group arranged in the peripheral area to be arranged between the display area and a first edge of the substrate, arranged outside the encapsulation layer, and comprising first connection wires; and a wire extending from within the display area to a portion between the display area and the first edge to face the first connection wire group, the wire having an end facing the first connection wire group, wherein the encapsulation layer comprises a main portion covering the display elements, a first protrusion protruding from the main portion to cover a first side end of the wire coupled to the end of the wire, and a second protrusion protruding from the main portion to cover a second side end of the wire coupled to the end of the wire.

19. The display apparatus of claim 18, wherein, when viewed in a plan view of the substrate, the first side end comprises a portion having an uneven shape.

20. The display apparatus of claim 18, wherein, when viewed in a plan view of the substrate, the second side end comprises a portion having an uneven shape.

21. The display apparatus of claim 18, wherein the first connection wires and the wire are arranged on the same layer.

22. The display apparatus of claim 18, wherein the wire comprises a three-layer structure.

23. The display apparatus of claim 22, wherein strengths of a lowermost layer and an uppermost layer of the wire are each greater than a strength of an intermediate layer of the wire.

24. The display apparatus of claim 22, wherein an area of an intermediate layer of the wire is smaller than that of an uppermost layer of the wire when viewed in a plan view of the substrate.

25. The display apparatus of claim 18, wherein the display elements comprise pixel electrodes and an opposite electrode arranged over the pixel electrodes and corresponding to the pixel electrodes, and wherein the wire is an electrode power supply line electrically coupled to the opposite electrode.

26. The display apparatus of claim 18, further comprising pixel circuits arranged in the display area and electrically coupled to the display elements, wherein the wire is a power supply line electrically coupled to the pixel circuits.

27. The display apparatus of claim 18, further comprising sensor wires configured to electrically connect the sensor electrode layer to the first connection wires.

28. The display apparatus of claim 27, wherein the sensor wires are electrically coupled to ends of the first connection wires facing the display area.

29. A display apparatus comprising:

a substrate comprising a display area and a peripheral area outside the display area;

display elements arranged at the display area of the substrate; and an encapsulation layer covering the display elements and comprising a first inorganic film and an organic film, wherein, when viewed in a plan view of the substrate, the first inorganic film has at least one recess at an edge corresponding to a first edge of the substrate, and wherein an edge of the organic film corresponding to the edge of the first inorganic film having the at least one recess is different in shape from the edge of the first inorganic film.

30. The display apparatus of claim 29, wherein the edge of the organic film has a straight shape.

31. The display apparatus of claim 29, wherein the at least one recess is recessed toward the display area.

32. The display apparatus of claim 29, wherein the substrate comprises a second edge opposite to the first edge with respect to a center of the display area, wherein, when viewed in a plan view of the substrate, the first inorganic film has at least one recess at an edge corresponding to the second edge of the substrate.

33. The display apparatus of claim 29, further comprising:
a sensor electrode layer arranged over the encapsulation layer and comprising a sensor area and a sensor peripheral area outside the sensor area; and
wires extending toward the first edge of the substrate from the sensor peripheral area to the outside of the first inorganic film,
wherein, when viewed in a plan view of the substrate, the wires overlap the at least one recess.

34. The display apparatus of claim 33, wherein the wires comprise sensor wires extending from the sensor peripheral area to the outside of the first inorganic film and first connection wires electrically coupled to the sensor wires.

35. The display apparatus of claim 34, wherein the sensor wires and the first connection wires are electrically coupled to each other through contact holes defined in an insulating layer between the sensor wires and the first connection wires.

36. The display apparatus of claim 29, wherein the encapsulation layer further comprises a second inorganic film, and an edge of the second inorganic film corresponding to the edge of the first inorganic film having the at least one recess has a shape corresponding to that of the edge of the first inorganic film having the at least one recess.

37. A display apparatus comprising:
a substrate comprising a display area and a peripheral area outside the display area;
display elements arranged at the display area of the substrate; and
an encapsulation layer covering the display elements and comprising a first inorganic film and an organic film,
wherein, when viewed in a plan view of the substrate, the first inorganic film has at least one recess at an edge corresponding to a first edge of the substrate,
wherein an edge of the organic film corresponding to the edge of the first inorganic film having the at least one recess has a shape corresponding to that of the first edge of the substrate.

* * * * *